US012217986B2

(12) United States Patent
Ogura et al.

(10) Patent No.: US 12,217,986 B2
(45) Date of Patent: *Feb. 4, 2025

(54) SUBSTRATE TREATING APPARATUS WITH PARALLEL FIRST AND SECOND PARTS OF SUBSTRATE TREATMENT LINES ON MULTIPLE STORIES FOR SIMULTANEOUSLY TREATING A PLURALITY OF SUBSTRATES

(71) Applicant: SCREEN Semiconductor Solutions Co., Ltd., Kyoto (JP)

(72) Inventors: Hiroyuki Ogura, Kyoto (JP); Tsuyoshi Mitsuhashi, Kyoto (JP); Yoshiteru Fukutomi, Kyoto (JP); Kenya Morinishi, Kyoto (JP); Yasuo Kawamatsu, Kyoto (JP); Hiromichi Nagashima, Kyoto (JP)

(73) Assignee: SCREEN Semiconductor Solutions Co., Ltd., Kyoto (JP)

( * ) Notice: Subject to any disclaimer, the term of this patent is extended or adjusted under 35 U.S.C. 154(b) by 514 days.

This patent is subject to a terminal disclaimer.

(21) Appl. No.: 17/145,039

(22) Filed: Jan. 8, 2021

(65) Prior Publication Data
US 2021/0134626 A1 May 6, 2021

Related U.S. Application Data

(63) Continuation of application No. 15/047,056, filed on Feb. 18, 2016, now abandoned, which is a (Continued)

(30) Foreign Application Priority Data

Dec. 28, 2007 (JP) .................... 2007-340428

(51) Int. Cl.
*H01L 21/677* (2006.01)
*B05C 9/12* (2006.01)
(Continued)

(52) U.S. Cl.
CPC .......... *H01L 21/67225* (2013.01); *B05C 9/12* (2013.01); *B05C 9/14* (2013.01);
(Continued)

(58) Field of Classification Search
CPC ........ H01L 21/67276; H01L 21/67253; G05B 19/41865
(Continued)

(56) References Cited

U.S. PATENT DOCUMENTS 4,409,889 A 10/1983 Burleson
4,985,722 A 1/1991 Ushijima et al.
(Continued)

FOREIGN PATENT DOCUMENTS

CN 1773672 5/2006
JP H01-241840 A1 9/1989
(Continued)

OTHER PUBLICATIONS

Yugma et al, "Integration of Scheduling and Advanced Process Control in Semiconductor Manufacturing: Review and Outlook", 2014, IEEE Explore, IEEE International Conference on Automation Science and Engineering, pp. 93-98. (Year: 2014).*
(Continued)

*Primary Examiner* — Karl Kurple
(74) *Attorney, Agent, or Firm* — Kilpatrick Townsend & Stockton LLP

(57) ABSTRACT

A substrate treating apparatus for treating substrates includes a plurality of substrate treatment lines arranged vertically for carrying out plural types of treatment on the substrates while transporting the substrates substantially horizontally, and a
(Continued)

controller for changing processes of treatment carried out on the substrates for each of the substrate treatment lines. By changing the processes of treatment carried out for the substrates for each substrate treatment line, the processes of treatment carried out for the substrates can be changed for each substrate conveniently. Thus, a plurality of different processes of treatment corresponding to the number of substrate treatment lines can be carried out in parallel for the respective substrates.

7 Claims, 18 Drawing Sheets

Related U.S. Application Data continuation of application No. 12/343,292, filed on Dec. 23, 2008, now Pat. No. 9,299,596.

(51) Int. Cl.
| | | |
|---|---|---|
| B05C 9/14 | (2006.01) | |
| B05C 13/00 | (2006.01) | |
| G03F 7/00 | (2006.01) | |
| H01L 21/67 | (2006.01) | |
| B05C 13/02 | (2006.01) | |
| B05D 3/04 | (2006.01) | |
| F24F 3/167 | (2021.01) | |

(52) U.S. Cl.
CPC .......... *B05C 13/00* (2013.01); *G03F 7/70841* (2013.01); *H01L 21/67109* (2013.01); *H01L 21/6715* (2013.01); *H01L 21/67173* (2013.01); *H01L 21/67178* (2013.01); *H01L 21/6719* (2013.01); *H01L 21/67196* (2013.01); *H01L 21/67276* (2013.01); *H01L 21/67742* (2013.01); *H01L 21/67748* (2013.01); *B05C 13/02* (2013.01); *B05D 3/0486* (2013.01); *F24F 3/167* (2021.01); *H01L 2224/27618* (2013.01)

(58) Field of Classification Search
USPC .......... 118/712; 156/345.24; 216/59; 700/100
See application file for complete search history.

(56) References Cited

U.S. PATENT DOCUMENTS

| | | | |
|---|---|---|---|
| 5,028,195 | A | 7/1991 | Ishii et al. |
| 5,100,516 | A | 3/1992 | Nishimura et al. |
| 5,102,283 | A | 4/1992 | Balzola |
| 5,177,514 | A | 1/1993 | Ushijima et al. |
| 5,202,716 | A | 4/1993 | Tateyama et al. |
| 5,275,709 | A | 1/1994 | Anderle et al. |
| 5,297,910 | A | 3/1994 | Yoshioka et al. |
| 5,430,271 | A | 7/1995 | Orgami et al. |
| 5,518,542 | A | 5/1996 | Matsukawa et al. |
| 5,536,128 | A | 7/1996 | Shimoyashiro et al. |
| 5,565,034 | A | 10/1996 | Nanbu et al. |
| 5,571,325 | A | 11/1996 | Ueyama et al. |
| 5,651,823 | A | 7/1997 | Parodi et al. |
| 5,664,254 | A | 9/1997 | Ohkura et al. |
| 5,668,056 | A | 9/1997 | Wu et al. |
| 5,668,733 | A | 9/1997 | Morimoto et al. |
| 5,672,205 | A | 9/1997 | Fujitmoto et al. |
| 5,677,758 | A | 10/1997 | McEachern et al. |
| 5,725,664 | A | 3/1998 | Nanbu et al. |
| 5,765,072 | A | 6/1998 | Ohtani et al. |
| 5,788,447 | A | 8/1998 | Yonemitsu et al. |
| 5,788,868 | A | 8/1998 | Itaba et al. |
| 5,803,932 | A | 9/1998 | Akimoto et al. |
| 5,820,679 | A | 10/1998 | Yokoyama et al. |
| 5,826,129 | A | 10/1998 | Hasebe et al. |
| 5,842,917 | A | 12/1998 | Soung et al. |
| 5,844,662 | A | 12/1998 | Akimoto et al. |
| 5,858,863 | A | 1/1999 | Yokoyama et al. |
| 5,876,280 | A | 3/1999 | Kitano et al. |
| 5,928,390 | A | 7/1999 | Yaegashi et al. |
| 5,937,223 | A | 8/1999 | Akimoto et al. |
| 5,962,070 | A | 10/1999 | Mitsuhashi et al. |
| 5,963,753 | A | 10/1999 | Ohtani et al. |
| 5,972,110 | A | 10/1999 | Akimoto |
| 5,976,199 | A | 11/1999 | Wu et al. |
| 6,007,629 | A | 12/1999 | Ohtani et al. |
| 6,010,570 | A | 1/2000 | Motoda et al. |
| 6,027,262 | A | 2/2000 | Akimoto |
| 6,062,798 | A | 5/2000 | Muka |
| 6,063,439 | A | 5/2000 | Semba et al. |
| 6,069,096 | A | 5/2000 | Nishihata et al. |
| 6,099,598 | A | 8/2000 | Yokoyama et al. |
| 6,099,643 | A | 8/2000 | Ohtani et al. |
| 6,116,841 | A | 9/2000 | Iwasaki |
| 6,133,981 | A | 10/2000 | Semba |
| 6,146,083 | A | 11/2000 | Iwasaki |
| 6,151,981 | A | 11/2000 | Costa |
| 6,161,969 | A | 12/2000 | Kimura et al. |
| 6,176,667 | B1 | 1/2001 | Fairbairn |
| 6,210,481 | B1 | 4/2001 | Sakai et al. |
| 6,227,786 | B1 | 5/2001 | Tateyama |
| 6,235,634 | B1 | 5/2001 | White et al. |
| 6,264,748 | B1 | 7/2001 | Kuriki et al. |
| 6,266,125 | B1 | 7/2001 | Fukuda et al. |
| 6,270,306 | B1 | 8/2001 | Otwell et al. |
| 6,287,023 | B1 | 9/2001 | Yaegashi et al. |
| 6,287,025 | B1 | 9/2001 | Matsuyama |
| 6,290,405 | B1 | 9/2001 | Ueda |
| 6,292,708 | B1 | 9/2001 | Allen et al. |
| 6,333,003 | B1 | 12/2001 | Katano et al. |
| 6,338,582 | B1 | 1/2002 | Ueda |
| 6,377,329 | B1 | 4/2002 | Takekuma |
| 6,382,849 | B1 | 5/2002 | Sakamoto et al. |
| 6,382,895 | B1 | 5/2002 | Konishi et al. |
| 6,402,401 | B1 | 6/2002 | Ueda et al. |
| 6,426,303 | B1 | 7/2002 | Ueda |
| 6,432,842 | B2 | 8/2002 | Akimoto et al. |
| 6,444,029 | B1 | 9/2002 | Kimura et al. |
| 6,454,472 | B1 | 9/2002 | Kim et al. |
| 6,461,438 | B1 | 10/2002 | Ookura et al. |
| 6,464,789 | B1 | 10/2002 | Akimoto |
| 6,466,300 | B1 | 10/2002 | Deguchi |
| 6,485,203 | B2 | 11/2002 | Katano et al. |
| 6,491,451 | B1 | 12/2002 | Stanley et al. |
| 6,511,315 | B2 | 1/2003 | Hashimoto |
| 6,537,835 | B2 | 3/2003 | Adachi et al. |
| 6,558,053 | B2 | 5/2003 | Shigemori et al. |
| 6,590,634 | B1 | 7/2003 | Nishi et al. |
| 6,645,880 | B1 | 11/2003 | Shigemori et al. |
| 6,654,668 | B1 | 11/2003 | Harada et al. |
| 6,680,775 | B1 | 1/2004 | Hirikawa |
| 6,698,944 | B2 | 3/2004 | Fujita |
| 6,750,155 | B2 | 6/2004 | Halsey et al. |
| 6,752,543 | B2 | 6/2004 | Fukutomi et al. |
| 6,752,872 | B2 | 6/2004 | Inada et al. |
| 6,758,647 | B2 | 7/2004 | Kaji et al. |
| 6,807,455 | B2 | 10/2004 | Yoshida et al. |
| 6,832,863 | B2 | 12/2004 | Sugimoto et al. |
| 6,879,866 | B2 | 4/2005 | Tel et al. |
| 6,889,014 | B2 | 5/2005 | Takano |
| 6,893,171 | B2 | 5/2005 | Fukutomi et al. |
| 6,910,497 | B2 | 6/2005 | Bernad |
| 6,919,001 | B2 | 7/2005 | Fairbairn et al. |
| 6,937,917 | B2 | 8/2005 | Akiyama et al. |
| 6,955,595 | B2 | 10/2005 | Kim |
| 6,982,102 | B2 | 1/2006 | Inada et al. |
| 7,001,674 | B2 | 2/2006 | Irie |
| 7,008,124 | B2 | 3/2006 | Miyata |
| 7,017,658 | B2 | 3/2006 | Hisai et al. |
| 7,053,990 | B2 | 5/2006 | Galburt et al. |
| 7,069,099 | B2 * | 6/2006 | Hashinoki ......... H01L 21/67276 700/121 |
| 7,072,730 | B2 | 7/2006 | Kobayashi et al. |
| 7,241,061 | B2 | 7/2007 | Akimoto et al. |

(56) References Cited

U.S. PATENT DOCUMENTS

| | | | |
|---|---|---|---|
| 7,245,348 B2 | 7/2007 | Akimoto et al. |
| 7,262,829 B2 | 8/2007 | Hayashida et al. |
| 7,279,067 B2 | 10/2007 | Yoshida et al. |
| 7,281,869 B2 | 10/2007 | Akimoto et al. |
| 7,317,961 B2 | 1/2008 | Hashinoki et al. |
| 7,322,756 B2 | 1/2008 | Akimoto et al. |
| 7,323,060 B2 | 1/2008 | Yamada et al. |
| 7,335,090 B2 | 2/2008 | Takahashi |
| 7,497,633 B2 | 3/2009 | Kaneyama |
| 7,522,823 B2 | 4/2009 | Fukimoto et al. |
| 7,525,650 B2 | 4/2009 | Shiga et al. |
| 7,537,401 B2 | 5/2009 | Kim et al. |
| 7,549,811 B2 | 6/2009 | Yamada et al. |
| 7,563,042 B2 | 7/2009 | Nakaharada et al. |
| 7,604,424 B2 | 10/2009 | Shigemori et al. |
| 7,641,405 B2 | 1/2010 | Fukutomi |
| 7,641,406 B2 | 1/2010 | Nishimura et al. |
| 7,645,081 B2 | 1/2010 | Hara et al. |
| 7,651,306 B2 | 1/2010 | Rice et al. |
| 7,652,276 B2 | 1/2010 | Hayakawa et al. |
| 7,661,894 B2 | 2/2010 | Matsuoka et al. |
| 7,675,048 B2 | 3/2010 | Binns et al. |
| 7,686,559 B2 | 3/2010 | Tsujimoto et al. |
| 7,692,764 B2 | 4/2010 | Shirata |
| 7,699,021 B2 | 4/2010 | Volfovski et al. |
| 7,729,798 B2 | 6/2010 | Hayashida et al. |
| 7,758,341 B2 | 7/2010 | Dong-Hun |
| 7,801,633 B2 | 9/2010 | Yamamoto et al. |
| 7,809,460 B2 | 10/2010 | Ishida et al. |
| 7,819,079 B2 | 10/2010 | Englhardt et al. |
| 7,836,845 B2 | 11/2010 | Tanoue et al. |
| 7,841,072 B2 | 11/2010 | Matsuoka et al. |
| 7,871,211 B2 | 1/2011 | Matsuoka et al. |
| 7,905,668 B2 | 3/2011 | Yamamoto |
| 7,925,377 B2 | 4/2011 | Ishikawa et al. |
| 7,934,880 B2 | 5/2011 | Hara et al. |
| 8,025,023 B2 | 9/2011 | Hayashida et al. |
| 8,034,190 B2 | 10/2011 | Yasuda et al. |
| 8,113,141 B2 | 2/2012 | Oh |
| 8,113,142 B2 | 2/2012 | Oh |
| 8,154,106 B2 | 4/2012 | Ishida et al. |
| 8,220,354 B2 | 7/2012 | Todorov |
| 8,268,384 B2 | 9/2012 | Matshuoka et al. |
| 8,289,496 B2 | 10/2012 | Kim et al. |
| 8,342,761 B2 | 1/2013 | Matsuoka |
| 8,353,986 B2 | 1/2013 | Sasaski et al. |
| 8,419,341 B2 | 4/2013 | Hoey et al. |
| 8,443,513 B2 | 5/2013 | Ishida et al. |
| 8,480,319 B2 | 7/2013 | Hayashi et al. |
| 8,545,118 B2 | 10/2013 | Ogura et al. |
| 8,560,108 B2 | 10/2013 | Matsuyana et al. |
| 8,588,950 B2 | 11/2013 | Nomura |
| 8,612,807 B2 | 12/2013 | Collins, Jr. |
| 8,631,809 B2 | 1/2014 | Hamada et al. |
| 8,708,587 B2 | 4/2014 | Ogura et al. |
| 8,731,701 B2 | 5/2014 | Tsukinoki et al. |
| 8,851,008 B2 | 10/2014 | Fukutomi et al. |
| 9,165,807 B2 | 10/2015 | Fukutomi et al. |
| 9,174,235 B2 | 11/2015 | Fukutomi et al. |
| 9,184,071 B2 | 11/2015 | Ogura et al. |
| 9,230,834 B2 | 1/2016 | Fukutomi et al. |
| 9,299,596 B2 | 3/2016 | Ogura et al. |
| 2001/0013161 A1 | 8/2001 | Kitano et al. |
| 2001/0013515 A1 | 8/2001 | Harada et al. |
| 2001/0031147 A1 | 10/2001 | Takamori et al. |
| 2002/0011207 A1 | 1/2002 | Uzawa et al. |
| 2002/0048509 A1 | 4/2002 | Sakata et al. |
| 2002/0053319 A1 | 5/2002 | Nagamine |
| 2002/0087230 A1 | 7/2002 | Kahn et al. |
| 2002/0152958 A1 | 10/2002 | Shigemori et al. |
| 2002/0176936 A1 | 11/2002 | Matsuyama |
| 2003/0060917 A1 | 3/2003 | Bun et al. |
| 2003/0079957 A1 | 5/2003 | Otaguro et al. |
| 2003/0098966 A1 | 5/2003 | Korenaga et al. |
| 2003/0108349 A1 | 6/2003 | Kanagawa |
| 2003/0131458 A1 | 7/2003 | Wang et al. |
| 2003/0147643 A1 | 8/2003 | Miyata et al. |
| 2003/0213431 A1 | 11/2003 | Fukutomi et al. |
| 2003/0216053 A1 | 11/2003 | Miyata |
| 2003/0217695 A1 | 11/2003 | Fukutomi et al. |
| 2004/0005149 A1 | 1/2004 | Sugimoto et al. |
| 2004/0007176 A1 | 1/2004 | Janakiraman et al. |
| 2004/0050321 A1 | 3/2004 | Kitano et al. |
| 2004/0061065 A1 | 4/2004 | Hashimoto et al. |
| 2004/0107020 A1 | 6/2004 | Yokoyama et al. |
| 2004/0122545 A1 | 6/2004 | Akiyama et al. |
| 2004/0182318 A1 | 9/2004 | Hashinoki et al. |
| 2004/0229441 A1 | 11/2004 | Sugimoto et al. |
| 2005/0010320 A1* | 1/2005 | Ueno ............... H01L 21/67276 700/121 |
| 2005/0030511 A1 | 2/2005 | Auer-Jongepier et al. |
| 2005/0042555 A1 | 2/2005 | Matsushita et al. |
| 2005/0058775 A1 | 3/2005 | Oku et al. |
| 2005/0061242 A1 | 3/2005 | Shiga et al. |
| 2005/0061441 A1 | 3/2005 | Hashinoki et al. |
| 2005/0069400 A1 | 3/2005 | Dickey et al. |
| 2005/0135905 A1 | 6/2005 | Moriya et al. |
| 2005/0203858 A1* | 9/2005 | Tai ...................... G06Q 30/0283 705/400 |
| 2005/0266323 A1 | 12/2005 | Raulea |
| 2006/0011296 A1 | 1/2006 | Higashi et al. |
| 2006/0024446 A1 | 2/2006 | Sugimoto et al. |
| 2006/0028630 A1 | 2/2006 | Akimoto |
| 2006/0062282 A1 | 3/2006 | Wright |
| 2006/0090849 A1 | 5/2006 | Toyoda et al. |
| 2006/0098978 A1 | 5/2006 | Yasuda et al. |
| 2006/0104635 A1 | 5/2006 | Kaneyama et al. |
| 2006/0130751 A1 | 6/2006 | Volfovski et al. |
| 2006/0134330 A1 | 6/2006 | Ishikawa et al. |
| 2006/0137726 A1 | 6/2006 | Sano et al. |
| 2006/0147202 A1 | 7/2006 | Yasuda et al. |
| 2006/0149403 A1 | 7/2006 | Shimizu et al. |
| 2006/0152694 A1 | 7/2006 | Yasuda et al. |
| 2006/0162858 A1 | 7/2006 | Akimoto et al. |
| 2006/0164613 A1 | 7/2006 | Akimoto et al. |
| 2006/0194445 A1 | 8/2006 | Hayashi et al. |
| 2006/0201423 A1 | 9/2006 | Akimoto et al. |
| 2006/0201615 A1 | 9/2006 | Matsuoka et al. |
| 2006/0219171 A1 | 10/2006 | Sasaki et al. |
| 2006/0286300 A1 | 12/2006 | Ishikawa et al. |
| 2007/0048979 A1 | 3/2007 | Fukuoka et al. |
| 2007/0056514 A1 | 3/2007 | Akimoto et al. |
| 2007/0058147 A1 | 3/2007 | Hamada |
| 2007/0088450 A1 | 4/2007 | Shinozuka et al. |
| 2007/0119479 A1 | 5/2007 | Yoshihara et al. |
| 2007/0128529 A1 | 6/2007 | Kazaana |
| 2007/0172234 A1 | 7/2007 | Shigemori et al. |
| 2007/0179658 A1 | 8/2007 | Hamada |
| 2007/0190437 A1 | 8/2007 | Kaneyama et al. |
| 2007/0219660 A1 | 9/2007 | Kaneko et al. |
| 2007/0245949 A1 | 10/2007 | Tanoue et al. |
| 2007/0274711 A1 | 11/2007 | Kaneyama et al. |
| 2007/0280680 A1 | 12/2007 | Kim et al. |
| 2007/0297794 A1 | 12/2007 | Park et al. |
| 2008/0004739 A1* | 1/2008 | Varadhan ......... G05B 19/41865 700/100 |
| 2008/0014333 A1 | 1/2008 | Matsuoka et al. |
| 2008/0021585 A1* | 1/2008 | Cheng ............... G06Q 10/06312 700/99 |
| 2008/0026153 A1 | 1/2008 | Hayashida et al. |
| 2008/0037013 A1 | 2/2008 | Yamamoto et al. |
| 2008/0070164 A1 | 3/2008 | Hayashida et al. |
| 2008/0078327 A1 | 4/2008 | Dong-Hun |
| 2008/0096149 A1 | 4/2008 | Dong-Hun |
| 2008/0125899 A1* | 5/2008 | Numakura ......... H01L 21/67196 156/345.32 |
| 2008/0129968 A1 | 6/2008 | Hayashida et al. |
| 2008/0158531 A1 | 7/2008 | Kiuchi |
| 2008/0212049 A1 | 9/2008 | Fukutomi et al. |
| 2008/0224817 A1 | 9/2008 | Vellore et al. |
| 2008/0269937 A1 | 10/2008 | Yamamoto |
| 2008/0304940 A1 | 12/2008 | Auer-Jongepier et al. |
| 2009/0000543 A1 | 1/2009 | Fukutomi et al. |
| 2009/0001071 A1 | 1/2009 | Kulkarni |

(56) References Cited

U.S. PATENT DOCUMENTS

| | | |
|---|---|---|
| 2009/0014126 A1 | 1/2009 | Ohtani et al. |
| 2009/0018686 A1 | 1/2009 | Yamamoto et al. |
| 2009/0044747 A1 | 2/2009 | Nishimura |
| 2009/0060480 A1 | 3/2009 | Herchen |
| 2009/0070946 A1 | 3/2009 | Tamada et al. |
| 2009/0098298 A1 | 4/2009 | Miyata et al. |
| 2009/0130614 A1 | 5/2009 | Ookouchi et al. |
| 2009/0139833 A1 | 6/2009 | Ogura |
| 2009/0142162 A1 | 6/2009 | Ogura et al. |
| 2009/0142713 A1 | 6/2009 | Yamamoto |
| 2009/0143903 A1 | 6/2009 | Blust et al. |
| 2009/0149982 A1 | 6/2009 | Higashi et al. |
| 2009/0165711 A1 | 7/2009 | Ogura et al. |
| 2009/0165950 A1 | 7/2009 | Kim et al. |
| 2009/0247053 A1 | 10/2009 | Lee |
| 2009/0291558 A1 | 11/2009 | Kim et al. |
| 2010/0040779 A1 | 2/2010 | Nagamine et al. |
| 2010/0050940 A1 | 3/2010 | Sahoda et al. |
| 2010/0057239 A1* | 3/2010 | Masuda ............ G05B 19/41865 700/105 |
| 2010/0061718 A1 | 3/2010 | Hara et al. |
| 2010/0126527 A1 | 5/2010 | Hamada |
| 2010/0136257 A1 | 6/2010 | Yasuda et al. |
| 2010/0183807 A1 | 7/2010 | Kim |
| 2010/0191362 A1 | 7/2010 | Tsukinoki |
| 2010/0192844 A1 | 8/2010 | Kim et al. |
| 2010/0195066 A1 | 8/2010 | Kim et al. |
| 2011/0043773 A1 | 2/2011 | Matsuoka |
| 2011/0063588 A1 | 3/2011 | Kashiyama et al. |
| 2011/0078898 A1 | 4/2011 | Ishida et al. |
| 2011/0082579 A1 | 4/2011 | Yoshida et al. |
| 2011/0208344 A1 | 8/2011 | Matsuyama et al. |
| 2011/0211825 A1 | 9/2011 | Matsuoka et al. |
| 2011/0218659 A1* | 9/2011 | Nomura ............ H01L 21/67276 29/25.01 |
| 2011/0242508 A1 | 10/2011 | Kobayashi |
| 2011/0276166 A1 | 11/2011 | Atanasoff |
| 2011/0297085 A1 | 12/2011 | Matsuyama et al. |
| 2012/0013730 A1 | 1/2012 | Koga |
| 2012/0013859 A1 | 1/2012 | Matsuoka et al. |
| 2012/0015307 A1 | 1/2012 | Matsuoka et al. |
| 2012/0029687 A1 | 2/2012 | Hagen et al. |
| 2012/0073461 A1 | 3/2012 | Terada et al. |
| 2012/0084059 A1 | 4/2012 | Akada |
| 2012/0086142 A1 | 4/2012 | Terada et al. |
| 2012/0097336 A1 | 4/2012 | Terada et al. |
| 2012/0135148 A1 | 5/2012 | Deguchi et al. |
| 2012/0271444 A1 | 10/2012 | Matsumoto |
| 2012/0307217 A1 | 12/2012 | Kim et al. |
| 2014/0003891 A1 | 1/2014 | Kobayashi |
| 2014/0046470 A1* | 2/2014 | Nomura ............ H01L 21/67745 700/109 |
| 2014/0152966 A1 | 6/2014 | Hwang et al. |
| 2014/0342558 A1 | 11/2014 | Ogura et al. |
| 2016/0008841 A1 | 1/2016 | Ogura et al. |
| 2016/0079099 A1 | 3/2016 | Fukutomi et al. |
| 2016/0163573 A1 | 6/2016 | Ogura et al. |
| 2019/0189490 A1* | 6/2019 | Morita ............... H01L 21/68771 |

FOREIGN PATENT DOCUMENTS

| | | |
|---|---|---|
| JP | H04-085812 A1 | 3/1992 |
| JP | H-085812 A1 | 3/1992 |
| JP | H05267148 A | 10/1993 |
| JP | H06-5689 A1 | 1/1994 |
| JP | H06-89934 A1 | 3/1994 |
| JP | H07-263302 A | 10/1995 |
| JP | H07-283094 A1 | 10/1995 |
| JP | H08-162514 A | 6/1996 |
| JP | H09-045613 A1 | 2/1997 |
| JP | H9-148240 A1 | 6/1997 |
| JP | 09-199568 | 7/1997 |
| JP | H09-213616 A | 8/1997 |
| JP | H09-251953 A1 | 9/1997 |
| JP | 09-312323 A1 | 12/1997 |
| JP | H10-50794 A1 | 2/1998 |
| JP | H10-74822 A1 | 3/1998 |
| JP | H10-144673 A1 | 5/1998 |
| JP | 10-146744 A1 | 6/1998 |
| JP | 10-209241 | 7/1998 |
| JP | H10-189420 A1 | 7/1998 |
| JP | 2000-68188 A | 8/1998 |
| JP | H10-261554 A | 9/1998 |
| JP | H10-261689 A1 | 9/1998 |
| JP | H10-294351 A1 | 11/1998 |
| JP | H10-335415 A1 | 12/1998 |
| JP | H11-3850 | 1/1999 |
| JP | H11-16978 A1 | 1/1999 |
| JP | H11-74168 A | 3/1999 |
| JP | H11-111603 A | 4/1999 |
| JP | H11-3851 | 6/1999 |
| JP | H11-156278 A | 6/1999 |
| JP | H11-251405 A1 | 9/1999 |
| JP | 11-340301 A | 12/1999 |
| JP | 2000-012443 A1 | 1/2000 |
| JP | 2000-049089 A1 | 2/2000 |
| JP | 2000-100886 A1 | 4/2000 |
| JP | 2000-124124 A1 | 4/2000 |
| JP | 2000-124129 A1 | 4/2000 |
| JP | 2000-182949 A | 6/2000 |
| JP | 2000-200822 A1 | 7/2000 |
| JP | 2000-311846 A | 7/2000 |
| JP | 2000-269297 A1 | 9/2000 |
| JP | 2000-331922 | 11/2000 |
| JP | 2000-332080 A1 | 11/2000 |
| JP | 2001-57334 A | 2/2001 |
| JP | 2001-102292 A | 4/2001 |
| JP | 2001-093827 A1 | 6/2001 |
| JP | 2001-176784 A | 6/2001 |
| JP | 2001-176792 A1 | 6/2001 |
| JP | 03-211749 A | 9/2001 |
| JP | 2002-353091 A | 12/2002 |
| JP | 2003-007594 A | 1/2003 |
| JP | 2003-059810 A1 | 2/2003 |
| JP | 2003-077785 A | 3/2003 |
| JP | 2003-178945 | 6/2003 |
| JP | 2003-224175 A1 | 8/2003 |
| JP | 2003-309160 A1 | 10/2003 |
| JP | 2003-324059 A1 | 11/2003 |
| JP | 2003-324139 | 11/2003 |
| JP | 2003-338496 A1 | 11/2003 |
| JP | 10-2004-31921 A1 | 1/2004 |
| JP | 2004-15021 A1 | 1/2004 |
| JP | 2004-015023 A1 | 1/2004 |
| JP | 2004-072061 A | 3/2004 |
| JP | 2004-087675 | 3/2004 |
| JP | 2004-046450 | 5/2004 |
| JP | 2004-146450 | 5/2004 |
| JP | 2004-152801 A1 | 5/2004 |
| JP | 2004-193597 A | 7/2004 |
| JP | 2004-200485 A1 | 7/2004 |
| JP | 2004-207279 A1 | 7/2004 |
| JP | 2004-241319 A1 | 8/2004 |
| JP | 2004-260129 | 9/2004 |
| JP | 3600711 | 9/2004 |
| JP | 2004-304003 A1 | 10/2004 |
| JP | 2004-311714 A1 | 11/2004 |
| JP | 2004-319767 A1 | 11/2004 |
| JP | 2004-336024 A | 11/2004 |
| JP | 2005-46694 A | 2/2005 |
| JP | 2005-57294 A | 3/2005 |
| JP | 2005-093920 A1 | 4/2005 |
| JP | 2005-101078 A1 | 4/2005 |
| JP | 2005-101079 A | 4/2005 |
| JP | 2005-123249 A1 | 5/2005 |
| JP | 2005-167083 A1 | 6/2005 |
| JP | 2005-210059 A | 8/2005 |
| JP | 2005-243690 A1 | 9/2005 |
| JP | 2005-303230 A | 10/2005 |
| JP | 2006-203075 | 8/2006 |
| JP | 2006-216614 A1 | 8/2006 |
| JP | 2006-228974 A1 | 8/2006 |
| JP | 2006-229183 A1 | 8/2006 |

(56) References Cited

FOREIGN PATENT DOCUMENTS

| | | |
|---|---|---|
| JP | 2006-245312 | 9/2006 |
| JP | 2006-253501 A1 | 9/2006 |
| JP | 2006-269672 A1 | 10/2006 |
| JP | 2006-287178 A1 | 10/2006 |
| JP | 2006-335484 A1 | 12/2006 |
| JP | 2007-005659 A1 | 1/2007 |
| JP | 2007-288029 A1 | 1/2007 |
| JP | 2007-067178 A1 | 3/2007 |
| JP | 3129794 U | 3/2007 |
| JP | 2007-150064 A | 6/2007 |
| JP | 2007-150071 A1 | 6/2007 |
| JP | 2007-158260 A1 | 6/2007 |
| JP | 2007-208064 A1 | 8/2007 |
| JP | 2007-227984 | 9/2007 |
| JP | 2007-287887 A1 | 11/2007 |
| JP | 2006-311624 A | 12/2008 |
| JP | 2009-99577 A1 | 5/2009 |
| JP | 2009-164256 A1 | 7/2009 |
| JP | 2006-253207 A1 | 9/2009 |
| JP | 2009-076893 A1 | 9/2009 |
| JP | 2002-510141 A1 | 4/2022 |
| KR | 1997-0011065 A1 | 3/1997 |
| KR | 1999-0023624 A | 3/1999 |
| KR | 2001-0029862 A | 4/2001 |
| KR | 2002-0035758 A1 | 5/2002 |
| KR | 10-0387418 B1 | 6/2003 |
| KR | 10-2003-0087418 A | 11/2003 |
| KR | 2003-0086900 A | 11/2003 |
| KR | 10-2004-0054517 A | 6/2004 |
| KR | 1020050049935 A1 | 5/2005 |
| KR | 10-2005-0051280 A | 6/2005 |
| KR | 10-2006-0033423 A | 4/2006 |
| KR | 10-2006-0088495 A | 4/2006 |
| KR | 2006-0050112 A | 5/2006 |
| KR | 10-2006-0085188 A | 7/2006 |
| KR | 10-2006-0092061 A | 8/2006 |
| KR | 10-2006-0097613 A | 9/2006 |
| KR | 10-0634122 B1 | 10/2006 |
| KR | 10-2007-0007262 A | 1/2007 |
| KR | 2007-0003328 A | 1/2007 |
| KR | 10-2007-0034979 A | 3/2007 |
| KR | 10-0698352 A | 3/2007 |
| KR | 10-2007-0062522 A | 6/2007 |
| TW | 276353 B | 5/1996 |
| TW | 2005-26494 A | 8/2005 |
| TW | 200631680 | 9/2006 |
| TW | I-268568 B | 12/2006 |

OTHER PUBLICATIONS

Office Action for corresponding Chinese Application No. 20081010225036.7 dated Sep. 18, 2009, 4 pages.
Office Action for corresponding Korean Application No. 10-2008-0060084 dated Mar. 9, 2010, 5 pages.
Notice of Allowance of Korean Application No. 10-2008-0118967 dated Oct. 21, 2010, 2 pages total.
Office Action for corresponding Korean Application No. 10-2008-0132304 mailed Oct. 25, 2010, 4 pages.
Office Action for corresponding Korean Application No. 10-2008-0132009 dated Jan. 18, 2011, 5 pages.
Invalidation Trial for corresponding Korean Patent No. 10-1001511 received on Apr. 13, 2011, 53 pages.
Notice of Allowance for corresponding Korean application No. 10-2010-0105888 dated Apr. 22, 2011, 3 pages.
Invalidation Trial for corresponding Korean Application No. 10-1010086 dated Apr. 25, 2011, 68 pages.
Office Action for corresponding Korean Application No. 10-2008-0132009 dated Jul. 21, 2011, 5 pages.
Office Action for corresponding Japanese Application No. 2007-172496 dated Sep. 27, 2011, 4 pages.
Invalidation Trial for corresponding Korean Patent No. 10-1036420 received on Sep. 27, 2011, 36 pages.
Office Action for corresponding Japanese Application No. 2007-340427 dated Oct. 4, 2011, 2 pages.
Office Action for corresponding Japanese Application No. 2007-340428 dated Oct. 4, 2011, 2 pages.
Invalidation Trial for corresponding Korean Patent No. 10-1047799 (Korean Patent application No. 10-2008-132304) received on Nov. 16, 2011, 69 pages.
Office Action for corresponding Japanese Application No. 2008-076610 dated Jan. 10, 2012, 2 pages.
Office Action for corresponding Japanese Application No. 2008-076611 dated Jan. 10, 2012, 2 pages.
Office Action for corresponding Japanese Application No. 2008-076608 dated Jan. 17, 2012, 4 pages.
Office Action for corresponding Taiwanese Application No. 097150911 dated Apr. 10, 2012, 6 pages.
Office Action for corresponding Japanese Application No. 2007-340428 dated Apr. 24, 2012, 3 pages.
Office Action for corresponding Japanese Application No. 2007-310676 dated May 8, 2012, 3 pages.
Office Action for corresponding Japanese Application No. 2007-310677 dated May 8, 2012, 4 pages.
Office Action for corresponding Taiwanese Application No. 097150912 dated Jun. 1, 2012, 6 pages.
Notice of Allowance for corresponding Korean Patent Application No. 10-2008-0132009 dated Jun. 22, 2012, 3 pages.
Office Action for corresponding Japanese Application No. 2007-310675 dated Jul. 31, 2012, 3 pages.
Decision of Patent for corresponding Japanese Patent Application No. 2007-310677 dated Oct. 16, 2012, 3 pages.
Office Action for corresponding Korean Patent Application No. 10-2012-0005204 dated Nov. 1, 2012, 6 pages.
Office Action for corresponding Japanese Patent Application No. 2008-327897 dated Nov. 6, 2012, 4 pages.
Office Action for corresponding Japanese Patent Application No. 2007-340430 dated Dec. 18, 2012, 3 pages.
Information Statement for corresponding Japanese Patent Application No. 2007-310676 dated Jan. 15, 2013, 4 pages.
Office Action for corresponding Japanese Patent Application No. 2011-265835 dated Apr. 23, 2013, 3 pages.
Trial Decision for corresponding Korean Patent No. 10-1047799 dated Jun. 25, 2013, 125 pages.
Office Action for corresponding Japanese Patent Application No. 2012-118585 dated Jun. 25, 2013, 3 pages.
Office Action for corresponding Japanese Patent Application No. 2011-257538 dated Jul. 2, 2013, 3 pages.
Invalidation Trial for corresponding Korean Patent No. 10-1213284 dated Jul. 3, 2013, 31 pages.
Invalidation trial for corresponding Taiwanese Patent No. 97124376 dated Jul. 30, 2013, 43 pages.
Invalidation Trial for corresponding Korean Patent No. 10-1170211 dated Aug. 7, 2013, 26 pages.
Office Action for corresponding Japanese Patent Application No. 2012-118584 dated Oct. 22, 2013, 2 pages.
Invalidation Trial for corresponding Korean Patent No. 10-1276946 dated Nov. 12, 2013, 52 pages.
Office Action for corresponding Japanese Patent Application No. 2011-257538 dated Dec. 3, 2013, 3 pages.
Argument in the Trial for Patent Invalidation for corresponding Korean Patent No. 10-1213284 dated Dec. 20, 2013, 19 pages.
Notice of Allowance for corresponding Korean Patent Application No. 10-2012-0005204 dated Jan. 22, 2014, 3 pages.
Argument in the Trial for Patent Invalidation for corresponding Korean Patent No. 10-1170211 dated Feb. 27, 2014, 21 pages. (English translation is not available).
Information Statement for corresponding Japanese Patent Application No. 2012-118583 dated May 16, 2014, 22 pages. (translation is not available).
Machine Translation of KR 10-2006-0033423 A published Apr. 19, 2006, 14 pages.
Office Action for corresponding Japanese Patent Application No. 2012-118583 dated Jun. 24, 2014, 2 pages. (translation is not available).

(56) References Cited

OTHER PUBLICATIONS

Argument in the Trial for Patent Invalidation for corresponding Korean Patent No. 10-1276946 dated May 28, 2014, 45 pages. (English translation is not available).
English Translation of JP 10-2006-0033423 published Apr. 2006.
Trial for Patent Invalidation for corresponding Korean Patent Application No. 10-1432358 dated Nov. 18, 2014, 54 pages. (English Translation is not available).
Office Action for corresponding Taiwanese Patent Application No. 101118484 dated Feb. 26, 2015, 15 pages. (English Translation is not available).
Trial for Patent Invalidation for corresponding Korean Patent Application No. 10-1432358, dated May 22, 2015, 60 pages. (English Translation is not available).
Decision to Dismiss Amendment for Japanese Patent Application No. 2015-083350, dated May 24, 2016, 3 pages.
Trial for Patent Invalidation for corresponding Taiwanese Patent Application No. I-394223 dated Oct. 20, 2015, 29 pages. (English translation is not available).
Trial Brief for Patent Invalidation for corresponding Korean Patent No. 10-1276946 dated Jul. 7, 2016, 69 pages. (English Translation is not available).
Notification of Reasons for Refusal for corresponding Japanese Patent Application No. 2014-253079, dated Nov. 15, 2016, 6 pages.
Notification of Reasons for Refusal for corresponding Japanese Patent Application No. 2016-22846, dated Sep. 26, 2017, 4 pages.
Patent Administrative Litigation document for corresponding Taiwan Patent No. I-394223 dated Sep. 25, 2017, 32 pages.
Second preparatory document for Litigation re Taiwan Patent No. I-394223, dated Mar. 26, 2018, 31 pages.
Decision of Refusal for corresponding Japanese Patent Application No. JP 2016-226846, dated Mar. 6, 2018, 6 pages.
Third preparatory document for Patent Administrative Litigation for corresponding Taiwan Patent No. I-394223, dated Apr. 27, 2018, 11 pages.
Lee, Chong Whan, Apr. 2006, ProQuest Dialog Translation (Apr. 1, 2014), 11 Pages.
Non-Final Office Action for U.S. Appl. No. 12/324,788 mailed May 27, 2011, 41 pages.
Non-Final Office Action for U.S. Appl. No. 12/163,951 mailed Jul. 11, 2011, 18 pages.
Non-Final Office Action for U.S. Appl. No. 12/343,302 mailed Aug. 19, 2011, 26 pages.
Non-Final Office Action for U.S. Appl. No. 12/324,802 mailed Sep. 14, 2011, 13 pages.
Non-Final Office Action for U.S. Appl. No. 12/343,292 mailed Oct. 28, 2011, 12 pages.
Final Office Action for U.S. Appl. No. 12/324,788 mailed Dec. 7, 2011, 26 pages.
Final Office Action for U.S. Appl. No. 12/163,951 mailed Jan. 19, 2012, 22 pages.
Non-Final Office Action for U.S. Appl. No. 12/324,794 mailed Feb. 3, 2012, 8 pages.
Final Office Action for U.S. Appl. No. 12/343,302 mailed Apr. 12, 2012, 33 pages.
Final Office Action for U.S. Appl. No. 12/324,802 mailed Apr. 20, 2012, 14 pages.
Final Office Action for U.S. Appl. No. 12/343,292 mailed Jun. 1, 2012, 15 pages.
Advisory Action for U.S. Appl. No. 12/343,292 mailed Oct. 12, 2012, 3 pages.
Non-Final Office Action for U.S. Appl. No. 13/401,625 mailed Mar. 14, 2013, 8 pages.
Notice of Allowance for U.S. Appl. No. 12/324,794 mailed May 29, 2013, 7 pages.
Non-Final Office Action for U.S. Appl. No. 13/401,644 mailed Jun. 21, 2013, 16 pages.
Non-Final Office Action for U.S. Appl. No. 13/401,617 mailed Sep. 17, 2013, 8 pages.
Final Office Action for U.S. Appl. No. 13/401,625 mailed Sep. 19, 2013, 11 pages.
Notice of Allowance for U.S. Appl. No. 14/011,993 mailed Oct. 7, 2013, 11 pages.
Final Office Action for U.S. Appl. No. 13/401,644 mailed Nov. 22, 2013, 20 pages.
Restriction Requirement for U.S. Appl. No. 12/163,951 mailed Feb. 3, 2014, 7 pages.
Non-Final Office Action for U.S. Appl. No. 13/401,625 mailed on Mar. 28, 2014, 11 pages.
Supplemental Notice of Allowance for U.S. Appl. No. 14/011,993 mailed on Apr. 1, 2014, 2 pages.
Non-Final Office Action for U.S. Appl. No. 13/401,644 mailed on Apr. 4, 2014, 10 pages.
Non-Final Office Action for U.S. Appl. No. 12/324,788 mailed on Apr. 4, 2014, 30 pages.
Non-Final Office Action for U.S. Appl. No. 12/324,802 mailed on Apr. 7, 2014, 17 pages.
Non-Final Office Action for U.S. Appl. No. 12/343,302 mailed on Apr. 10, 2014, 22 pages.
Restriction Requirement for U.S. Appl. No. 12/343,292 mailed on Apr. 10, 2014, 6 pages.
Final Office Action for U.S. Appl. No. 13/401,617 mailed on Jun. 2, 2014, 10 pages.
Notice of Allowance for U.S. Appl. No. 12/163,951 mailed on Jul. 10, 2014, 9 pages.
Final Office Action for U.S. Appl. No. 12/324,802 mailed on Oct. 22, 2014, 24 pages.
Final Office Action for U.S. Appl. No. 12/343,292 mailed on Nov. 5, 2014, 20 pages.
Final Office Action for U.S. Appl. No. 12/324,788 mailed on Nov. 6, 2014, 44 pages.
Advisory Action for U.S. Appl. No. 13/401,617 mailed on Nov. 7, 2014, 4 pages.
Final Office Action for U.S. Appl. No. 13/401,644 mailed on Dec. 1, 2014, 20 pages.
Non-Final Office Action for U.S. Appl. No. 13/401,625 mailed on Dec. 9, 2014, 16 pages.
Non-Final Office Action for U.S. Appl. No. 13/401,617 mailed on Feb. 2, 2015, 11 pages.
Non-Final Office Action for U.S. Appl. No. 12/343,292 mailed on Jun. 3, 2015, 25 pages.
Notice of Allowance for U.S. Appl. No. 13/401,625 mailed on Jun. 16, 2015, 15 pages.
Notice of Allowance for U.S. Appl. No. 12/324,802 mailed on Jun. 26, 2015, 20 pages.
Notice of Allowance for U.S. Appl. No. 13/401,644 mailed on Jun. 29, 2015, 15 pages.
Notice of Allowance for U.S. Appl. No. 13/401,617 mailed on Sep. 2, 2015, 14 pages.
Notice of Allowance for U.S. Appl. No. 12/343,292 mailed on Nov. 18, 2015, 20 pages.
Notice of Allowance for U.S. Appl. No. 14/447,409 mailed on Feb. 18, 2016, 14 pages.
Non-Final Office Action for U.S. Appl. No. 14/863,375 mailed on Oct. 3, 2016, 9 pages.
Non-Final Office Action for U.S. Appl. No. 15/047,056 mailed on Aug. 2, 2017, 42 pages.
Final Office Action for U.S. Appl. No. 15/047,056 mailed on Jan. 18, 2018, 61 pages.
Non-Final Office Action for U.S. Appl. No. 14/952,657 mailed on Jan. 22, 2018, 60 pages.
Notice of Allowance for U.S. Appl. No. 14/952,657 mailed on Jun. 26, 2015, 20 pages.
Non-Final Office Action for U.S. Appl. No. 15/047,056 mailed on Nov. 2, 2018, 49 pages.
Final Office Action for U.S. Appl. No. 15/047,056 mailed on May 28, 2019, 51 pages.
Office Action for Japanese Patent Application No. 2018-107919 mailed May 28, 2019, 5 pages, 11 pages with machine translation.
Office Action for Japanese Patent Application No. 2018-107919 mailed Aug. 27, 2019, 4 pages, 8 pages with machine translation.

(56) References Cited

OTHER PUBLICATIONS

Non-Final Office Action for U.S. Appl. No. 15/047,056 mailed on Feb. 19, 2020, 53 pages.
Final Office Action for U.S. Appl. No. 15/047,056 mailed on Jul. 15, 2020, 52 pages.

* cited by examiner

SUBSTRATE TREATING APPARATUS WITH PARALLEL FIRST AND SECOND PARTS OF SUBSTRATE TREATMENT LINES ON MULTIPLE STORIES FOR SIMULTANEOUSLY TREATING A PLURALITY OF SUBSTRATES

CROSS-REFERENCES TO RELATED APPLICATIONS

This application is a continuation of U.S. application Ser. No. 15/047,056, filed Feb. 18, 2016, which is a continuation of U.S. application Ser. No. 12/343,292, filed on Dec. 23, 2008, now U.S. Pat. No. 9,299,596, which claims priority to Japanese Patent Application JP 2007-340428, filed on Dec. 28, 2007, the entire disclosures of which are hereby incorporated by reference in their entirety for all purposes.

BACKGROUND OF THE INVENTION

This invention relates to a substrate treating apparatus for performing a series of treatments of substrates such as semiconductor wafers, glass substrates for liquid crystal displays, glass substrates for photomasks, and substrates for optical disks (hereinafter called simply "substrates").

Conventionally, this type of apparatus includes a substrate treating apparatus used to form a resist film on substrates, and develop the substrates exposed in a separate exposing machine. This apparatus includes a treating section having, arranged therein, a coating block for carrying out resist film forming treatment, a developing block for carrying out developing treatment, and so on. Each such treating block includes a single main transport mechanism, and various treating units. The main transport mechanism of each treating block, while transporting substrates to the treating units in that block, transfers the substrates to and from the main transport mechanism of another, adjacent treating block. Thus, a plurality of substrates are successively transported to various treating units to receive a series of treatments. The series of treatments includes a process for forming resist film on the substrates and developing the substrates, for example. This process includes a plurality of different type treatments interposed by the exposing treatment in the external exposing machine. Each main transport mechanism transports the plurality of substrates in parallel to carry out successively the processes of treatment for each substrate (as disclosed in Japanese Unexamined Patent Publication No. 2003-324139, for example).

The conventional apparatus with such a construction has the following drawbacks.

For example, it may be desired to operate the apparatus such that, while putting certain of the treating units to a test run, the other treating units are used to carry out a series of treatments for substrates. Or it may be desired to operate the apparatus to carry out the process for forming resist film and developing some substrates, and at the same time to carry out the process for forming resist film on other substrates. A "process" here may include a plurality of different types of treatment, or may include a single treatment.

However, different processes between the substrates require different substrate transport paths to the various treating units. Therefore, the main transport mechanisms cannot transport the substrates efficiently. With the conventional apparatus, it is difficult to change the processes of treatment for each substrate. In other words, the conventional apparatus has difficulty in proceeding with a plurality of processes in parallel.

SUMMARY OF THE INVENTION

This invention has been made having regard to the state of the art noted above, and its object is to provide a substrate treating apparatus that can change substrate treating processes for each substrate, thereby proceeding with two or more different processes of treatment in parallel.

The above object is fulfilled, according to this invention, by a substrate treating apparatus comprising a plurality of substrate treatment lines for carrying out plural types of treatment on substrates while transporting the substrates substantially horizontally; and a controller for changing processes of treatment carried out on the substrates for each of the substrate treatment lines.

According to this invention, a plurality of substrate treatment lines and a controller are provided so that the processes of treatment carried out for substrates can be changed for each substrate treatment line. Therefore, according to a substrate treatment line to transport the substrates, the processes of treatment carried out for substrates can be changed for each substrate. This allows the types of processes corresponding to the number of substrate treatment lines to be carried out for the substrates in parallel.

In the invention noted above, the substrate treatment lines may be arranged vertically. By arranging the plurality of substrate treatment line in a way to overlap one another in the vertical direction, an increase in footprint can be avoided.

In the invention noted above, the controller may be capable of making processes in the substrate treatment lines different between the substrate treatment lines; and capable of making processes in the substrate treatment lines uniform for all the substrate treatment lines. By making processes for treating the substrates uniform for all the substrate treatment lines, the substrates having been treated through the same process can be obtained from all the substrate treatment lines. By making processes for treating the substrates different between the substrate treatment lines, various substrates having been treated through different processes can be obtained from the substrate treatment lines.

In the invention noted above, the controller may be capable of making the processes in all the substrate treatment lines a process for forming resist film on the substrates and a process for developing the substrates. Then, the substrate treatment lines can conveniently carry out a series of treatments to form resist film on the substrates and develop the substrates. Thus, substrates having resist film formed thereon and developed can be obtained from all the substrate treatment lines.

In the invention noted above, the controller may be arranged to cause part of the substrate treatment lines to treat the substrates in a process in a normal operation, and other of the substrate treatment lines to treat the substrates in a process in a test run. The substrate treatment lines can carry out separately and in parallel a normal operation to treat the substrates in a process in the normal operation, and a test run to treat the substrates in a process in the test run. This provides the effect of inhibiting a lowering of the working rate of this apparatus even at the time of a test run.

In the invention noted above, the controller may be capable of making the process in part of the substrate treatment lines all of a process for forming resist film on the substrates and developing the substrates, and making the process in other of the substrate treatment lines part of the process for forming resist film on the substrates and developing the substrates. Then, substrates having resist film formed thereon and developed can be obtained from part of the substrate treatment lines, and substrates having undergone part of the series of treatments to form resist film and develop can be obtained from other of the substrate treatment lines.

In the invention noted above, the process in the other of the substrate treatment lines may be one of a process for forming resist film on the substrates and a process for developing the substrates. Then, substrates having resist film formed thereon or developed substrates can be obtained from the other of the substrate treatment lines.

In the invention noted above, the controller may be capable of causing part of the substrate treatment lines to carry out a process including a plurality of different type treatments, and causing other of the substrate treatment lines to carry out a process including a single treatment. Then, substrates having received a plurality of different type treatments can be obtained from part of the substrate treatment lines, and substrates having received a single treatment can be obtained from other of the substrate treatment lines.

In the invention noted above, the process including a single treatment may be a process including one of resist film material coating treatment for applying a resist film material to the substrates, developing treatment for supplying a developer to the substrates, and heat treatment for heating or cooling the substrates. Then, substrates having received only the resist film material coating treatment, developing treatment or heat treatment can be obtained from the other of the substrate treatment lines.

In the invention noted above, the controller may be capable of causing part of the substrate treatment lines to carry out a first process including a plurality of different type treatments, and causing other of the substrate treatment lines to carry out a second process including a plurality of different type treatments and different from the first process. Then, part of the substrate treatment lines and other of the substrate treatment lines can carry out a plurality of different type treatments different from each other.

In the invention noted above, at least one of the first process and the second process may include at least one of resist film material coating treatment for applying a resist film material to the substrates, developing treatment for supplying a developer to the substrates, and heat treatment for heating or cooling the substrates. Then, at least one of the substrate treatment lines can carry out a process relating to the resist film material coating treatment, a process relating to the developing treatment, or a process relating to the heat treatment.

In another aspect of this invention, a substrate treating apparatus comprises a plurality of treating blocks arranged in juxtaposition, each having treating units provided on each of stories arranged vertically for treating substrates, and a main transport mechanism provided on each of the stories for transporting the substrates to and from the treating units on each of the stories, each of the treating blocks being capable of carrying out a series of treatments for the substrates on each of the stories, with the substrates transferred between the main transport mechanisms on the same stories of the treating blocks adjacent each other; and a controller for controlling each main transport mechanism to change substrate transport paths to and from the treating units on each of the stories.

According to this invention, a plurality of treating blocks each having a plurality of stories and a controller for changing substrate transport paths for each of the stories are provided to change substrate treatment for each story. This allows the types of treatment corresponding to the number of stories of the treating blocks to be carried out in parallel.

In the invention noted above, the controller may be capable of causing all or part of the series of treatments to be carried out for the substrates on each of the stories. Then, all of the series of treatments can be carried out for the substrates on each story. Part of the series of treatments can be carried out for the substrates on each story. The controller controls treatment on each story independently of the other stories. Consequently, desired treatment can be carried out for the substrates on each story.

In the invention noted above, on a story having treating units put to a test run, the controller may be arranged to cause the substrates to be transported only to the treating units put to the test run. By transporting the substrates only to the treating units put to the test run, the quality of treatment given by the treating units to the substrates can be examined, verified and checked conveniently.

In the invention noted above, the apparatus may further comprise an input unit for inputting information to set substrate transport paths to each of the stories, wherein the controller is arranged to change the transport paths on each of the stories based on the information inputted to the input unit. With the input unit provided, the controller changes substrate transport paths to the treating units for each story. Thus, the particulars of the treatment carried out for the substrates on each story can be changed simply.

In the invention noted above, the information inputted to the input unit may be information on types and an order of treatment carried out for the substrates on each of the stories. According to the information on the types and order of treatment carried out for the substrates on each story, the controller can change properly the substrate transport paths to the treating units for each story.

In the invention noted above, the information inputted to the input unit may be information identifying treating units put to a test run. According to the information identifying treating units put to a test run, the controller can change conveniently the transport paths on the story where these treating units are provided. Preferably, for example, the controller transports the substrates only to these treating units. This is because a test run can be carried out on these treating units.

In the invention noted above, the treating blocks may include a coating block and a developing block. The coating block has as the treating units coating units for applying a treating solution to the substrates; and the developing block has as the treating units developing units for supplying a developer to the substrates. Then, coating treatment for applying a treating solution to the substrates and developing treatment for supplying a developer to the substrates can be carried out on each story of the treating section.

In the invention noted above, the controller may be capable of causing the substrates loaded onto all of the stories of the coating block to be fed out of the coating block after being treated in the coating units; and capable of causing the substrates loaded onto part of the stories of the coating block to be fed out of the coating block after being treated in the coating units, and causing the substrates loaded onto other of the stories of the coating block to be fed out of the coating block without being transported to the coating units. In the first instance the coating treatment can be carried out on all the stories of the coating block. In the second instance while the coating treatment is carried out on part of the stories of the coating block, the coating treatment can be omitted on other of the stories of the coating block.

In the invention noted above, the controller may be capable of causing the substrates loaded onto all of the stories of the developing block to be fed out of the developing block after being treated in the developing units; and capable of causing the substrates loaded onto part of the stories of the developing block to be fed out of the developing block after being treated in the developing units, and causing the substrates loaded onto other of the stories of the developing block to be fed out of the developing block without being transported to the developing units. In the first instance the developing treatment can be carried out on all the stories of the developing block. In the second instance while the developing treatment is carried out on part of the stories of the developing block, the developing treatment can be omitted on other of the stories of the developing block.

This specification discloses an invention directed to the following substrate treating apparatus:

(1) The apparatus according to an embodiment wherein each of the substrate treatment lines includes a plurality of treating units and main transport mechanisms for transporting the substrates to and from the treating units. Since each substrate treatment line has its own treating units and main transport mechanisms, the controller can conveniently change substrate transport paths to the treating units for each substrate treatment line.

(2) The apparatus according to an embodiment wherein the process in the other of the substrate treatment lines is a process including a single treatment. Then, substrates having received a single treatment can be obtained from the other of the substrate treatment lines.

(3) The apparatus according to an embodiment wherein the process including a plurality of different type treatments includes at least one of resist film material coating treatment for applying a resist film material to the substrates, developing treatment for supplying a developer to the substrates, and heat treatment for heating or cooling the substrates. Then, a process relating to the resist film material coating treatment, a process relating to the developing treatment or a process relating to the heat treatment can be carried out in the part of the substrate treatment lines which carry out the process including a plurality of different type treatments.

(4) The apparatus according to an embodiment wherein the process including a plurality of different type treatments includes at least one of resist film material coating treatment for applying a resist film material to the substrates and developing treatment for supplying a developer to the substrates. Then, substrates with resist film formed thereon or developed substrates can be obtained from the part of the substrate treatment lines which carry out the process including a plurality of different type treatments.

(5) The apparatus according to an embodiment wherein a first process and a second process each includes at least one of resist film material coating treatment for applying a resist film material to the substrates, developing treatment for supplying a developer to the substrates, and heat treatment for heating or cooling the substrates. Then, each of the different parts of the substrate treatment lines can carry out a process relating to the resist film material coating treatment, a process relating to the developing treatment, or a process relating to the heat treatment.

(6) The apparatus according to an embodiment wherein a first process is a process for forming resist film on the substrates and developing the substrates, and a second process is one of a process for forming resist film on the substrates and a process for developing the substrates. Then, substrates having resist film formed thereon and developed can be obtained from one part of the substrate treatment lines, while substrates having resist film formed thereon or developed substrates can be obtained from another part of the substrate treatment lines.

(7) The apparatus according to an embodiment wherein one of a first process and a second process is a process for forming resist film on the substrates, and another of a first process and a second process is a process for developing the substrates. Then, substrates having resist film formed thereon can be obtained from one part of the substrate treatment lines, while developed substrates can be obtained from another part of the substrate treatment lines.

(8) The apparatus according to an embodiment, wherein in one instance the controller is capable of causing all the substrate treatment lines to carry out processes for forming resist film on the substrates and developing the substrates, including resist film material coating treatment for applying a resist film material to the substrates, developing treatment for supplying a developer to the substrates, and heat treatment for heating or cooling the substrates, and in another instance is capable of causing part of the substrate treatment lines to carry out processes for forming resist film on the substrates and developing the substrates, including the resist film material coating treatment, the developing treatment and the heat treatment, and causing another part of the substrate treatment lines to carry out one of a process for forming resist film on the substrates, including the resist film material coating treatment and the heat treatment, and a process for developing the substrates, including the developing treatment and the heat treatment. Then, in the first instance substrates having resist film formed thereon and developed can be obtained from all the substrate treatment lines. In the second instance, substrates having resist film formed thereon and developed can be obtained from a part of the substrate treatment lines, while substrates having resist film formed thereon or developed substrates can be obtained from the other of the substrate treatment lines.

(9) The apparatus according to an embodiment, wherein the coating units are resist film coating units for applying a resist film material to the substrates. Then, the coating block can conveniently form resist film on the substrates.

(10) The apparatus according to claim an embodiment, wherein the coating block further includes, as the treating units, heat-treating units for heat-treating the substrates, and the developing block further includes, as the treating units, heat-treating units for heat-treating the substrates. Then, the coating block can conveniently proceed with the treatment in the coating units and heat-treating units. The developing block also can conveniently proceed with the treatment in the developing units and heat-treating units.

(11) The apparatus according to an embodiment, wherein the coating block and the developing block are arranged adjacent each other. Then, the processes including the treatments in the coating units and developing units can be carried out smoothly.

(12) The apparatus according to (11) above, further comprising an indexer section disposed adjacent the coating block for transporting substrates to and from a cassette configured to store a plurality of substrates, and transferring the substrates to and from each main transport mechanism of the coating block. Since the coating block can transfer the substrates to and from the indexer section, the particulars of treatment on each story can be changed flexibly.

(13) The apparatus according to (11) above, further comprising an interface section disposed adjacent the developing block for transporting the substrates to and from an exposing machine provided separately from the apparatus, and transferring the substrates to and from each main transport mechanism of the developing block. Since the developing block can transfer the substrates to and from the interface section, the particulars of treatment on each story can be changed flexibly.

(14) An embodiment of a substrate treating apparatus comprising a plurality of substrate treatment lines arranged vertically for carrying out a series of treatments on substrates while transporting the substrates substantially horizontally; and a controller capable of causing each of the substrate treatment lines to carry out all of the series of treatments on the substrates, and to carry out only part of the series of treatments. According to this embodiment with the plurality of substrate treatment lines and the controller, each substrate treatment line can be changed between all of the series of treatments and part of the series of treatments carried out on the substrates. It is thus possible to proceed with the types of treatment corresponding to the number of substrate treatment lines in parallel.

(15) An embodiment according to (14) above wherein the controller is capable of causing all of the substrate treatment lines to carry out all of the series of treatments on the substrates, and capable of causing part of the substrate treatment lines to carry out all of the series of treatments on the substrates, while causing other of the substrate treatment lines to carry out part of the series of treatments on the substrates. All of the substrate treatment lines can carry out all of the series of treatments on the substrates. Part of the substrate treatment lines can carry out all of the series of treatments on the substrates, while other of the substrate treatment lines can carry out part of the series of treatments on the substrates.

(16) An embodiment according to (14) above wherein the controller is capable of causing part of the substrate treatment lines to engage in a normal operation for carrying out all of the series of treatments on the substrates, and causing other of the substrate treatment lines to engage in a test run for carrying out part of the series of treatments on the substrates. Thus, part of the substrate treatment lines can engage in a normal operation while other of the substrate treatment lines is put to a test run so that the other substrate treatment line may be restored to its normal state.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE INVENTION

A preferred embodiment of this invention will be described in detail hereinafter with reference to the drawings.

Figure 1:
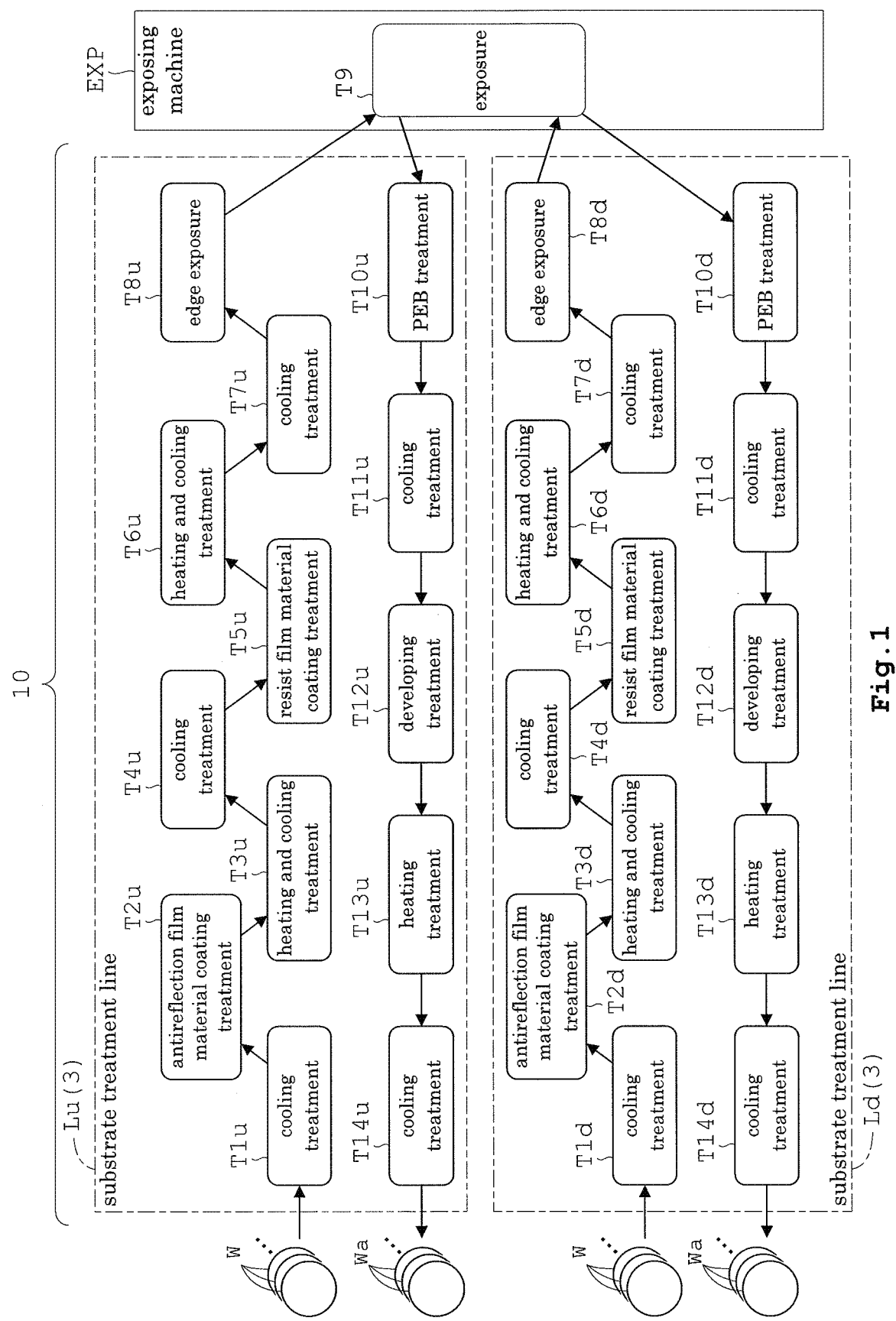
FIG. 1 is a schematic view showing an outline of a substrate treating apparatus according to this invention.
Figure 2:
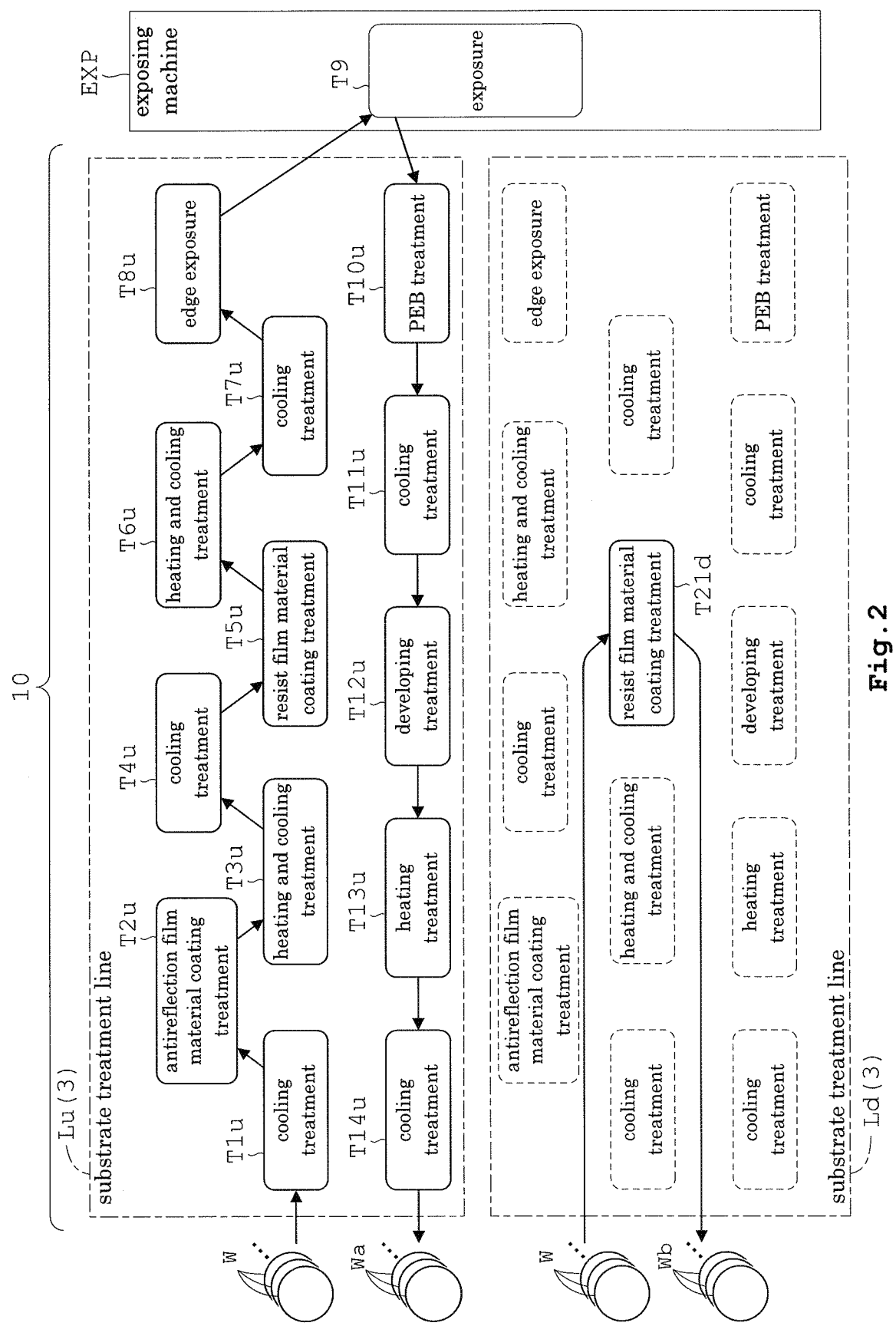
FIG. 2 is a schematic view showing an outline of a substrate treating apparatus according to this invention.

An outline of this embodiment will be described first. FIGS. 1 and 2 are schematic views showing an outline of a substrate treating apparatus according to an embodiment of this invention. FIG. 1 shows an example of treating substrates in the same process through all substrate treatment lines. FIG. 2 shows an example of treating substrates in different processes through the substrate treatment lines.

This embodiment provides a substrate treating apparatus 10 for forming resist film on substrates (e.g. semiconductor wafers) W, and developing exposed wafers W. The substrate treating apparatus 10 will be abbreviated hereinafter as the apparatus 10 as appropriate. This apparatus 10 has two substrate treatment lines Lu and Ld for performing a plurality of different type treatments for the wafers W while transporting the wafers W substantially horizontally. The substrate treatment lines Lu and Ld are arranged one over the other. The substrate treatment lines Lu and Ld constitute a treating section 3. In the following description, the substrate treatment lines Lu and Ld will be referred to simply as the substrate treatment lines L when they are not distinguished. This apparatus 10 has an exposing machine EXP, which is separate from this apparatus 10, disposed adjacent an interface section described hereinafter. The exposing machine EXP is used to expose the wafers W.

The treatment that can be carried out in each substrate treatment line L is roughly divided into coating treatment, heat treatment, edge exposure and developing treatment. The coating treatment includes antireflection film material coating treatment and resist film material coating treatment. The heat treatment includes cooling treatment, heating treatment, heating and cooling treatment, and PEB (Post Exposure Bake) treatment. Although the PEB treatment is also called post-exposure baking treatment, this specification uses the term "PEB treatment".

In FIG. 1, the substrate treatment lines Lu and Ld carry out the same process of treatment for the wafers W. The process in each of the substrate treatment lines Lu and Ld includes a plurality of different type treatments. Specifically, the process in each substrate treatment line L includes cooling treatment T1, antireflection film material coating treatment T2, heating and cooling treatment T3, cooling treatment T4, resist film material coating treatment T5, heating and cooling treatment T6, cooling treatment T7, edge exposure T8, PEB treatment T10, cooling treatment T11, developing treatment T12, heating treatment T13 and cooling treatment T14, which are carried out in the stated order. Sign "u" affixed to the various treatments T1-T8 and T10-T14 indicates the treatments carried out in the substrate treatment line Lu, while sign "d" indicates the treatments carried out in the substrate treatment line Ld. Inserted after the edge exposure T8 and before the PEB treatment T10 is exposure T9 carried out by the exposing machine EXP.

The series of treatments from the cooling treatment T1$u$ to the edge exposure T8$u$ and from the PEB treatment T10$u$ to the cooling treatment T14$u$ corresponds to the "process for forming resist film on the substrates, and for developing the substrates" in this invention. Similarly, the series of treatments from the cooling treatment T1$d$ to the edge exposure T8$d$ and from the PEB treatment T10$d$ to the cooling treatment T14$d$ corresponds to the "process for forming resist film on the substrates and for developing the substrates" in this invention. In the following description, the "process for forming resist film on the substrates and for developing the substrates" will be called the "coating and developing process" as appropriate.

The substrate treatment lines Lu and Ld carry out the coating and developing process in parallel, thereby to obtain wafers W with resist film formed thereon and developed from each substrate treatment line Lu or Ld. In FIG. 1, sign "Wa" is affixed to wafers W having received the treatment in the coating and developing process.

When each process in the substrate treatment line Lu or Ld is aimed at substrate treatment, the process is one executed during a normal operation. When each process in the substrate treatment line Lu or Ld is aimed at checking or testing of treatment quality, or at a test run of the treating units, the process is one executed during a test run.

In FIG. 2, the substrate treatment lines Lu and Ld carry out different processes. The process in the substrate treatment line Lu is the coating and developing process. The process in the substrate treatment line Ld consists of a single treatment (resist film material coating treatment T21$d$). Consequently, while wafers W with resist film formed thereon and developed are obtained from the substrate treatment line Lu, wafers W having received the resist film material coating treatment can be obtained from the substrate treatment line Ld. In FIG. 2, sign "Wa" is affixed to the wafers W having received the treatment in the coating and developing process, and sign "Wb" to the wafers W having received the resist film material coating treatment.

In the example shown in FIG. 2 also, each process in the substrate treatment line Lu or Ld aimed at a test run is one executed during a test run, and that aimed at substrate treatment is one executed during a normal operation.

Although other examples of operation in this apparatus are not illustrated, the processes in the substrate treatment lines Lu and Ld may be changed as desired. Changes in the processes in the substrate treatment line Lu and changes in the processes in the substrate treatment line Ld can be made independently of each other.

For example, the processes in the substrate treatment lines Lu and Ld can be all or part of the coating and developing process. Part of the coating and developing process may, for example, be a process for forming resist film on the wafers W (hereinafter called "resist process" as appropriate), or a process for developing the wafers W (hereinafter called "developing process" as appropriate). The resist process may, for example, be a series of treatments from the cooling treatment T1 to the edge exposure T8. The developing process may, for example, be a series of treatments from the PEB treatment T10 to the cooling treatment T14. In addition, part of the coating and developing process may, for example, include the resist film material coating treatment T5 and processes relating thereto, the developing T12 and processes relating thereto, and heat treatment and processes relating thereto. It is also possible to select, as desired, processes from the cooling treatment T4 to the heating and cooling treatment T6, or a process consisting only of the edge exposure T8.

From a different viewpoint, each of the processes in the substrate treatment lines Lu and Ld may be a process consisting of a single treatment, or a process having a plurality of different type treatments. The process consisting of a single treatment includes any one of the treatments T1-T8 and T10-T14. The process having a plurality of different type treatments may, for example, include the cooling treatment T14, heating and cooling treatment T3, and developing treatment T12. The number of treatments included in the process having a plurality of different type treatments may be larger or smaller than the number of treatments included in the coating and developing process. The order of treatments in the process having a plurality of different type treatments may be the same as or different from the order of treatments in the coating and developing process.

Each process in the substrate treatment lines Lu and Ld may be a process during a normal operation, or a process during a test run. Therefore, processes during a test run may be executed on both substrate treatment lines Lu and Ld.

Figure 18:
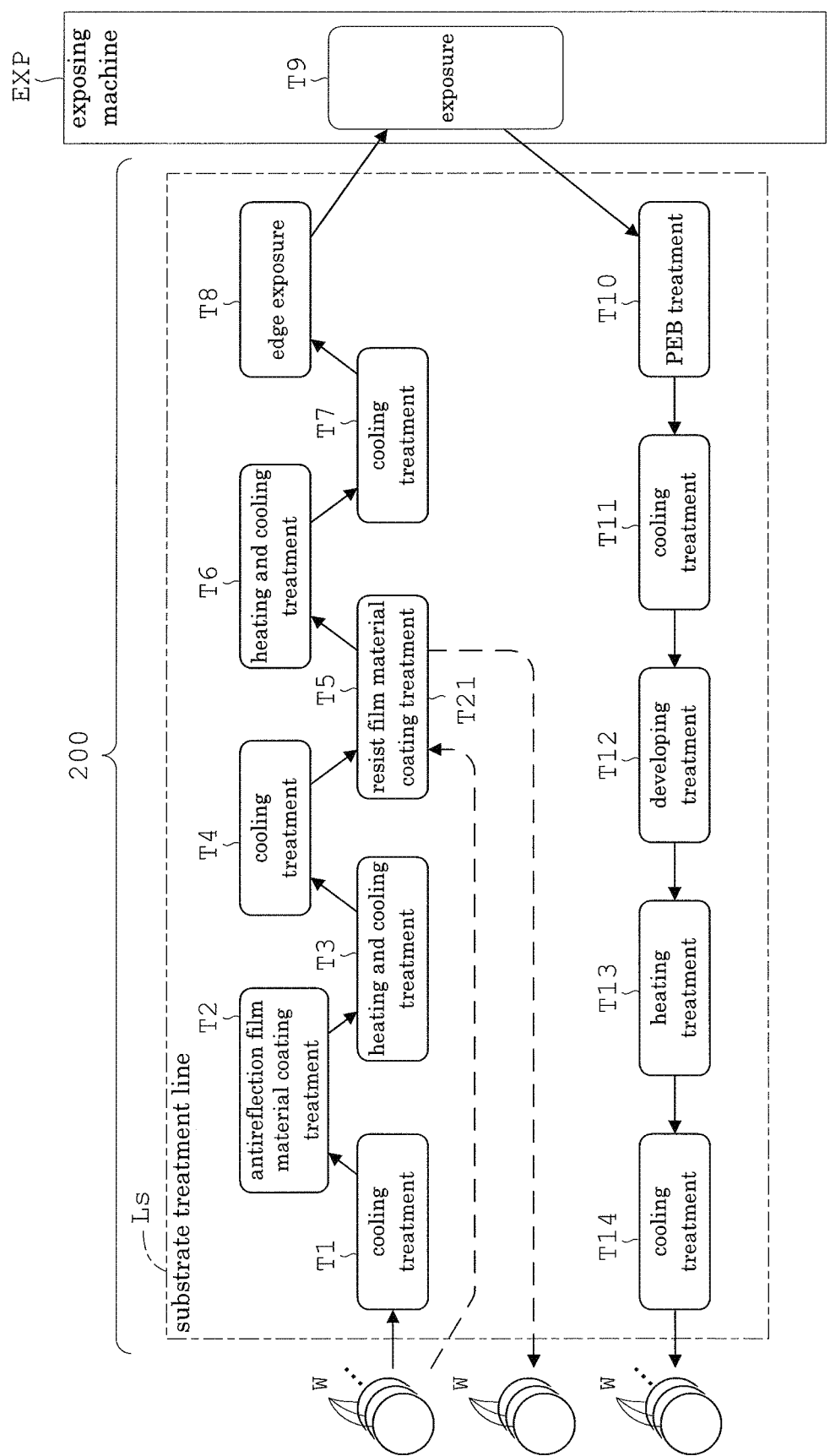
FIG. 18 is a schematic view showing an outline of a substrate treating apparatus in a comparative example.

This embodiment will now be compared with a comparative example. FIG. 18 is a schematic view showing an outline of a substrate treating apparatus in the comparative example. The substrate treating apparatus shown in FIG. 18 has a single substrate treatment line Ls. When the coating and developing process and the process consisting only of resist film material coating treatment are carried out in parallel in this substrate treatment line Ls, wafers W are transported along a path shown in solid lines in FIG. 18 (coating and developing process), while wafers W are transported along a path shown in dotted lines (process consisting only of resist film material coating treatment). When the wafers W are transported alternately along the two transport paths in the single substrate treatment line Ls as above, the wafer transporting efficiency falls as a whole, and the control for transporting the wafers W becomes very complicated.

On the other hand, as shown in FIGS. 1 and 2, it is clear that this apparatus 10 has a higher wafer transporting efficiency, and that the control for transporting the wafers W is simpler and easier.

Thus, this apparatus 10 with two substrate treatment lines Lu and Ld can conveniently realize an operation to treat wafers W in parallel through the same process in the substrate treatment lines Lu and Ld, and an operation to treat wafers W in parallel through different processes in the substrate treatment lines Lu and Ld. In the former case, wafers W treated in the same process can be obtained from the substrate treatment lines Lu and Ld. In the latter case, wafers W treated in different processes can be obtained simultaneously from the substrate treatment lines Lu and Ld. Further, by selecting the substrate treatment line Lu or Ld for transporting wafers W, processes of treatment can be varied for different wafers W.

Figure 3:
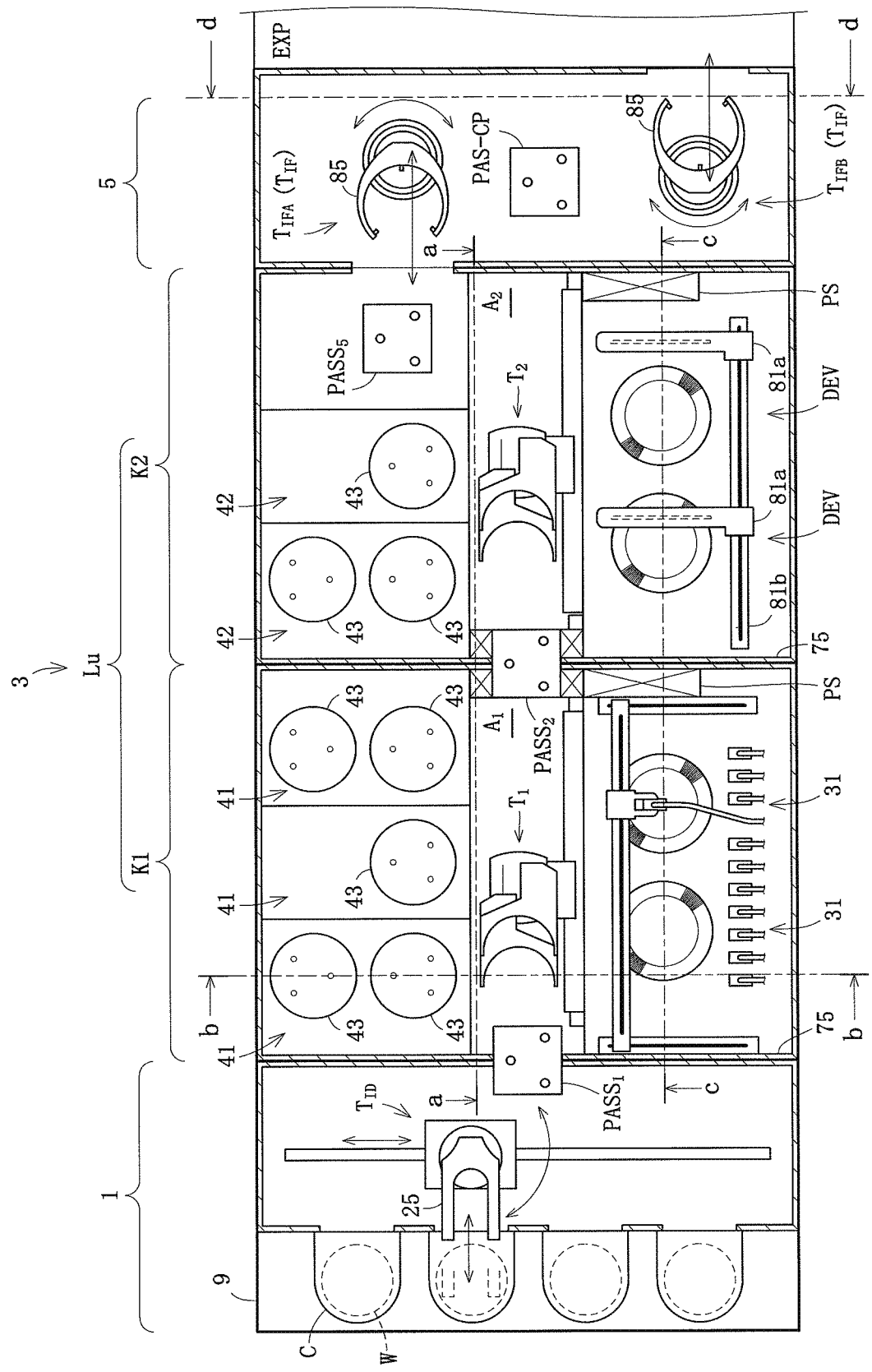
FIG. 3 is a plan view showing an outline of the substrate treating apparatus according to this invention.
Figure 4:
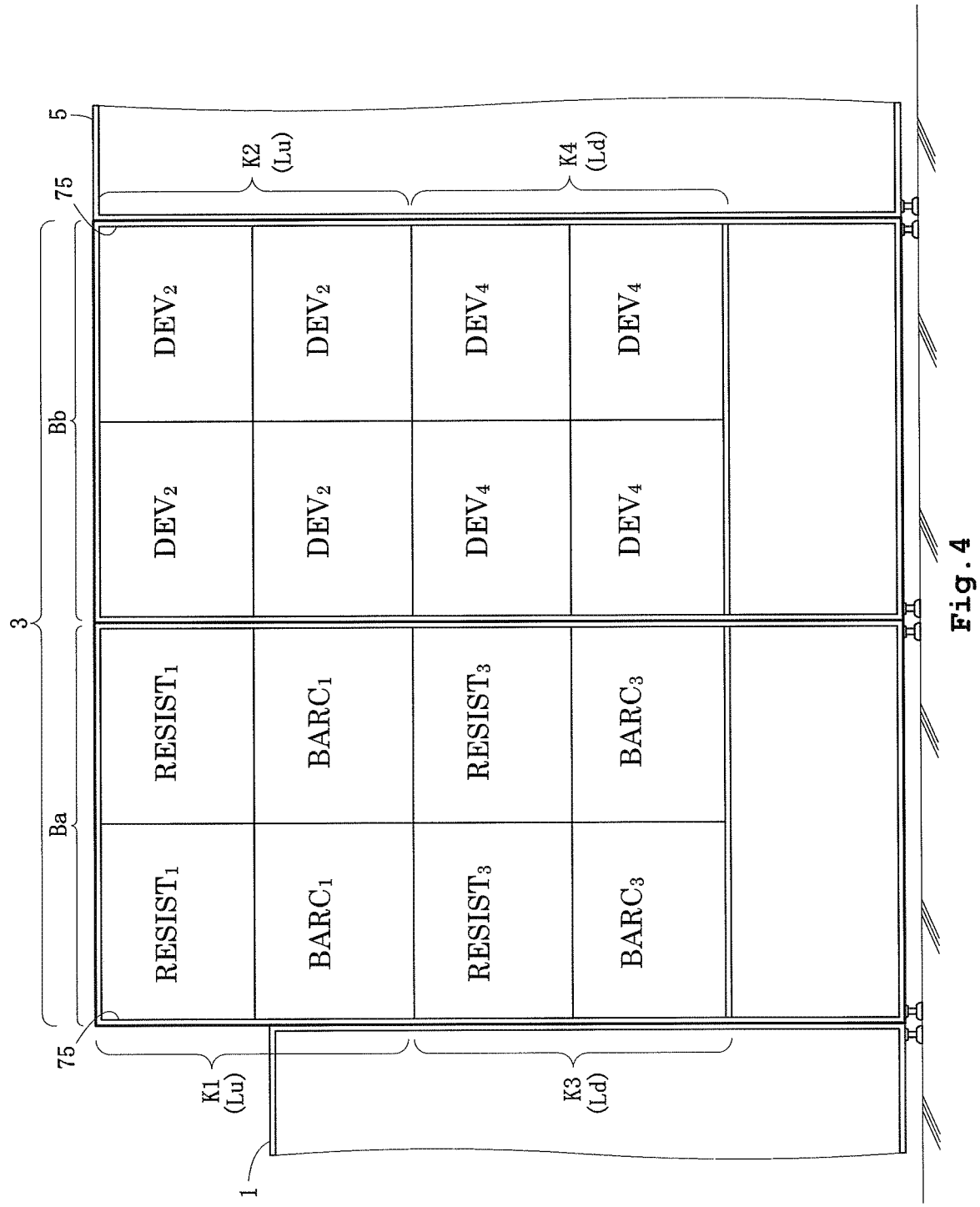
FIG. 4 is a schematic side view showing an arrangement of treating units included in the substrate treating apparatus.
Figure 5:
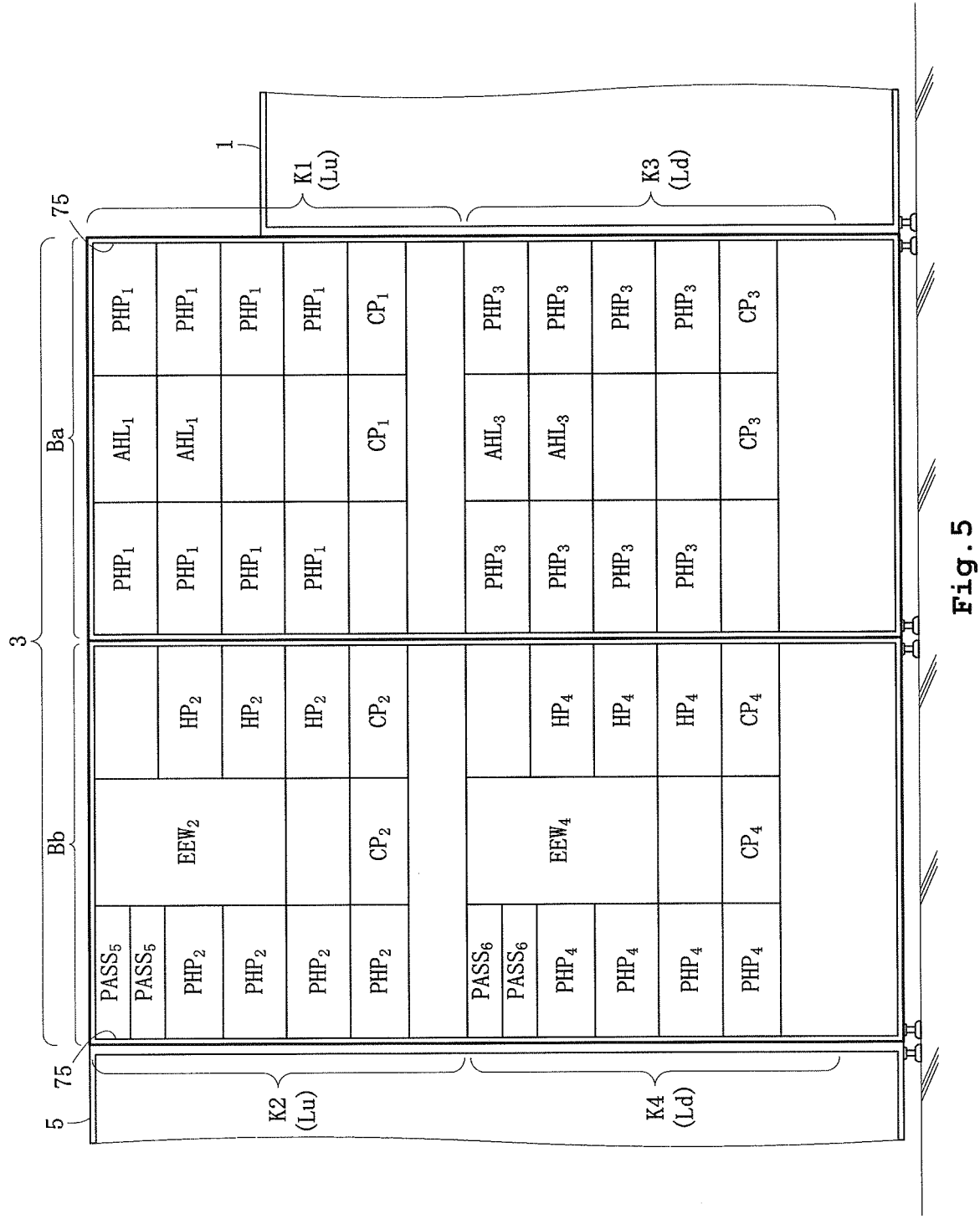
FIG. 5 is a schematic side view showing an arrangement of treating units included in the substrate treating apparatus.

This embodiment will be described in greater detail hereinafter. FIG. 3 is a plan view showing an outline of the substrate treating apparatus according to this embodiment. FIGS. 4 and 5 are schematic side views showing an arrangement of treating units included in the substrate treating apparatus. FIGS. 6 through 9 are views in vertical section taken on lines a-a, b-b, c-c and d-d of FIG. 3, respectively.

This apparatus 10 includes, besides the treating section 3 described above, an indexer section (hereinafter called "ID section") 1, and an interface section (hereinafter called "IF section") 5. The ID section 1 is located adjacent one side of the treating section 3, and IF section 5 is located adjacent the other side of the treating section 3. The exposing machine EXP, which is an external apparatus separate from this apparatus 10, is disposed adjacent to the IF section 5. The ID section 1 receives wafers W transported to the apparatus 10 from outside, and transfers the wafers W to the treating section 3. The IF section 5 transfers the wafers W between the treating section 3 and exposing machine EXP. Each of the ID section 1, treating section 3 and IF section 5 will be described hereinafter.

ID Section 1

Figure 6:
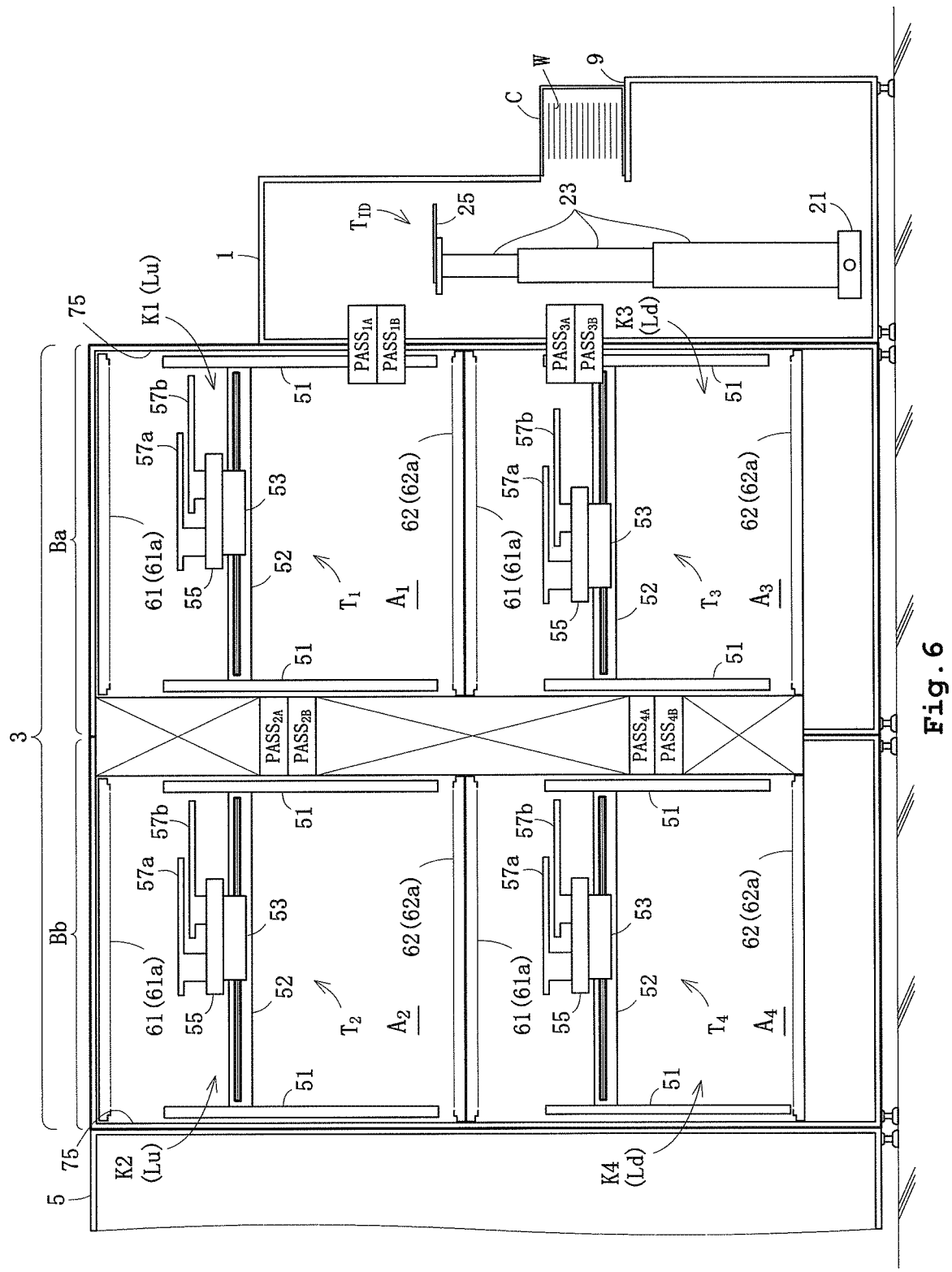
FIG. 6 is a view in vertical section taken on line a-a of FIG. 3.

The ID section 1 takes wafers W out of each cassette C, which stores a plurality of wafers W, and deposits wafers W in the cassette C. The ID section 1 has a cassette table 9 for receiving cassettes C. The cassette table 9 can receive four cassettes C as arranged in a row. The ID section 1 has also an ID transport mechanism $T_{ID}$. The ID transport mechanism $T_{ID}$ transports wafers W to and from each cassette C, and transports wafers W to and from receivers $PASS_1$ and $PASS_3$ to be described hereinafter. As shown in FIG. 6, the ID transport mechanism $T_{ID}$ has a movable base 21 for moving horizontally alongside the cassette table 9 in the direction of arrangement of the cassettes C, a lift shaft 23 vertically extendible and contractible relative to the movable base 21, and a holding arm 25 swivelable on the lift shaft 23, and extendible and retractable radially of the swivel motion, for holding a wafer W.

Treating Section 3

Each substrate treatment line L of the treating section 3 is arranged to transport wafers W substantially horizontally between the ID section 1 and IF section 5. Each substrate treatment line L has main transport mechanisms T for transporting the wafers W. In this embodiment, each substrate treatment line L has a plurality of main transport mechanisms T (two for each substrate treatment line L, and thus a total of four). The plurality of main transport mechanisms T of each substrate treatment line L are arranged in the direction in which the wafers W are transported, and the wafers W can be transferred between the main transport mechanisms T adjacent each other in the transport direction. Each main transport mechanism T, while transporting wafers W to various treating units described hereinafter, transfers wafers W to the other main transport mechanism T adjacent thereto.

Specifically, the substrate treatment line Lu includes a main transport mechanism $T_1$ and a main transport mechanism $T_2$ arranged in a row. The main transport mechanism $T_1$ is disposed adjacent the ID section, while the main transport mechanism $T_2$ is disposed adjacent the IF section 5. Similarly, the substrate treatment line Ld includes a main transport mechanism $T_3$ and a main transport mechanism $T_4$ arranged in a row. The main transport mechanism $T_3$ is disposed adjacent the ID section, while the main transport mechanism $T_4$ is disposed adjacent the IF section 5.

In this embodiment, the treating section 3 which has the above substrate treatment lines L includes a plurality of (two) treating blocks Ba and Bb arranged side by side (in substantially the same direction as the transport direction). The treating block Ba is located adjacent the ID section 1, while the treating block Bb is located adjacent the IF section 5. Each of the treating blocks Ba and Bb is vertically divided into a plurality of (two) stories K. The above main transport mechanism $T_1$ is disposed on the upper story K1 of the treating block Ba, while the main transport mechanism $T_3$ is disposed on the lower story K3. Similarly, the main transport mechanism $T_2$ is disposed on the upper story K2 of the treating block Bb, while the main transport mechanism $T_4$ is disposed on the lower story K4.

The wafers W can be transferred between the main transport mechanisms $T_1$ and $T_2$ on the same stories K1 and K2 of the adjoining treating blocks Ba and Bb. The stories K1 and K2 constitute the substrate treatment line Lu. Similarly, the wafers W can be transferred between the main transport mechanisms $T_3$ and $T_4$, and the stories K3 and K4 constitute the substrate treatment line Ld.

Treating Section 3—Treating Block Ba

Receivers $PASS_1$ and $PASS_3$ for receiving wafers W are provided between the ID section 1 and the respective stories K1 and K3 of the treating block Ba. The receiver $PASS_1$ receives, as temporarily placed thereon, wafers W passed between the ID transport mechanism $T_{ID}$ and the main transport mechanism $T_1$. Similarly, the receiver $PASS_3$ receives, as temporarily placed thereon, wafers W passed between the ID transport mechanism $T_{ID}$ and the main transport mechanism $T_3$. Seen in a sectional view, the receiver $PASS_1$ is disposed at a height adjacent a lower part of the upper story K2, while the receiver $PASS_3$ is disposed at a height adjacent an upper part of the lower story K3. Thus, the positions of receiver $PASS_1$ and receiver $PASS_3$ are relatively close to each other for allowing the ID transport mechanism $T_{ID}$ to move between the receiver $PASS_1$ and receiver $PASS_3$ through using only a small amount of vertical movement.

Receivers $PASS_2$ and $PASS_4$ for receiving wafers W are provided also between the treating blocks Ba and Bb. The receiver $PASS_2$ is disposed between the story K1 and story K2, and the receiver $PASS_4$ between the story K3 and story K4. The main transport mechanisms $T_1$ and $T_2$ transfer wafers W through the receiver $PASS_2$, and the main transport mechanisms $T_3$ and $T_4$ through the receiver $PASS_4$.

The receiver $PASS_1$ includes a plurality of receivers (two in this embodiment). These receivers $PASS_1$ are arranged vertically adjacent each other. Of the two receivers $PASS_1$, one $PASS_{1A}$ receives wafers W passed from the ID transport mechanism $T_{ID}$ to the main transport mechanism $T_1$. The other receiver $PASS_{1B}$ receives wafers W passed from the main transport mechanism $T_1$ to the ID transport mechanism $T_{ID}$. Each of the receivers $PASS_2$-$PASS_4$ and receivers $PASS_5$ and $PASS_{1B}$ described hereinafter similarly includes a plurality of (two) receivers, one of which is selected according to a direction for transferring wafers W. Each of the receivers $PASS_{1A}$ and $PASS_{1B}$ has a sensor (not shown) for detecting presence or absence of a wafer W. Based on detection signals of each sensor, the transfer of wafers W by the ID transport mechanism $T_{ID}$ and main transport mechanism $T_1$ is controlled. Similar sensors are attached also to the receivers $PASS_2$-$PASS_6$, respectively.

The story K1 will now be described. The main transport mechanism $T_1$ is movable in a transporting space $A_1$ extending substantially through the center of the story K1 and parallel to the direction of transport. The story K1 has, arranged thereon, coating units 31 for applying a treating solution to wafers W, and heat-treating units 41 for heat-treating the wafers W. The coating units 31 are arranged on one side of the transporting space $A_1$, while the heat-treating units 41 are arranged on the other side thereof.

The coating units 31 are arranged vertically and horizontally, each facing the transporting space $A_1$. In this embodiment, four coating units 31 in total are arranged in two columns and two rows.

The coating units 31 include anti-reflection film coating units BARC for coating an anti-reflection film material on the wafers W, and resist film coating units RESIST for coating a resist film material on the wafers W. In this specification, the treatment carried out in the anti-reflection film coating units BARC is referred to as anti-reflection film coating treatment as appropriate, and the treatment carried out in the resist film coating units RESIST as resist film coating treatment.

The plurality of (two) anti-reflection film coating units BARC are arranged at substantially the same height in the lower row. The plurality of resist film coating units RESIST are arranged at substantially the same height in the upper row. No dividing wall or partition is provided between the antireflection film coating units BARC. That is, all the antireflection film coating units BARC are only housed in a common chamber, and the atmosphere around each antireflection film coating unit BARC is not blocked off (i.e. is in communication). Similarly, the atmosphere around each resist film coating unit RESIST is not blocked off.

Figure 10A:
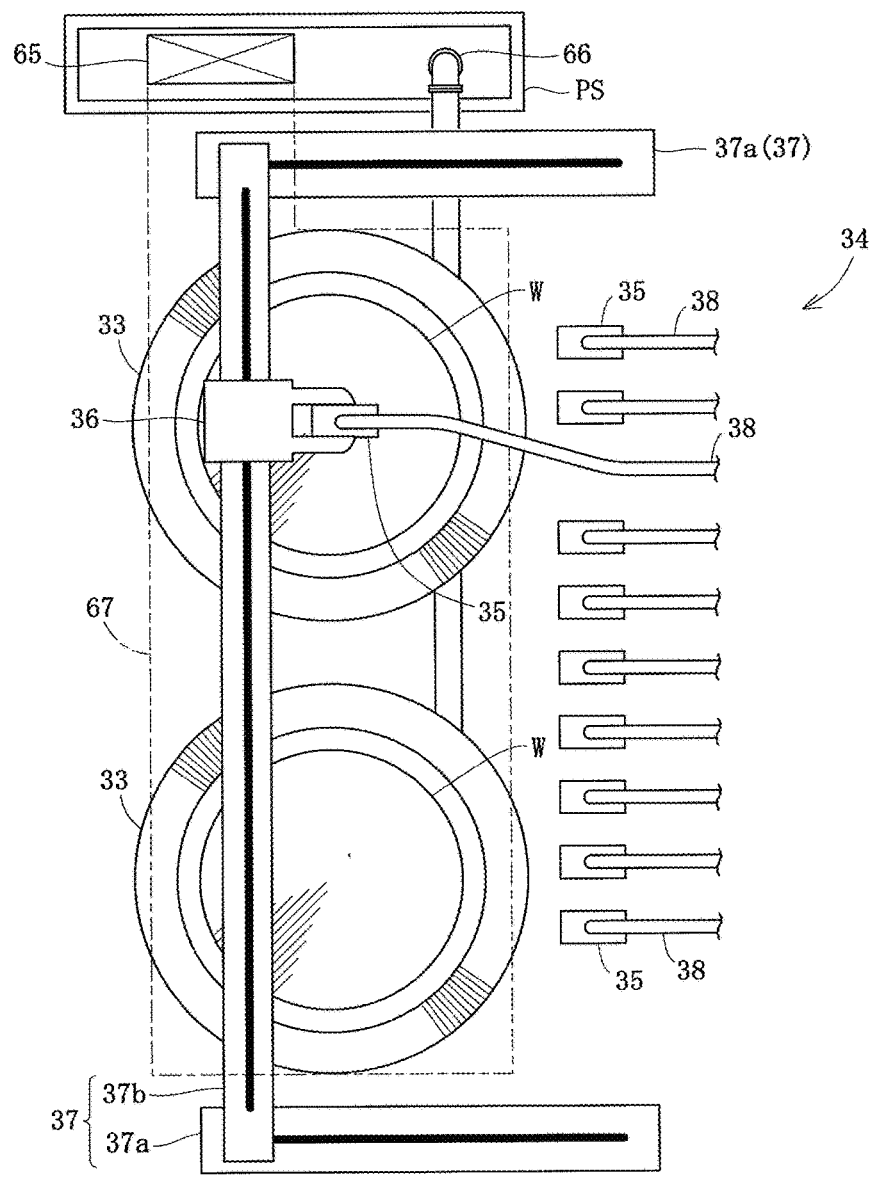
FIG. 10A is a plan view of coating units.
Figure 10B:
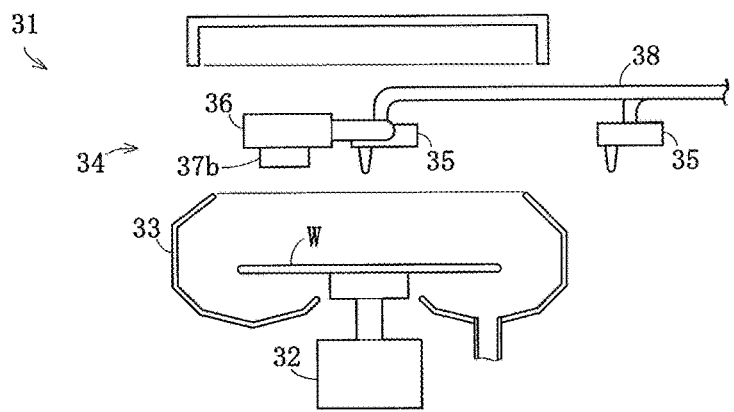
FIG. 10B is a sectional view of a coating unit.

Reference is made to FIGS. 10A and 10B. FIG. 10A is a plan view of the coating units 31. FIG. 10B is a sectional view of a coating unit 31. Each coating unit 31 includes a spin holder 32 for holding and spinning a wafer W, a cup 33 surrounding the wafer W, and a supply device 34 for supplying a treating solution to the wafer W.

The supply device 34 includes a plurality of nozzles 35, a gripper 36 for gripping one of the nozzles 35, and a nozzle moving mechanism 37 for moving the gripper 36 to move one of the nozzles 35 between a treating position above the wafer W and a standby position away from above the wafer W. Each nozzle 35 has one end of a treating solution pipe 38 connected thereto. The treating solution pipe 38 is arranged movable (flexible) to permit movement of the nozzle 35 between the standby position and treating position. The other end of each treating solution pipe 38 is connected to a treating solution source (not shown). Specifically, in the case of antireflection film coating units BARC, the treating solution sources supply different types of treating solution for antireflection film to the respective nozzles 35. In the case of resist film coating units RESIST, the treating solution sources supply different types of resist film material to the respective nozzles 35.

The nozzle moving mechanism 37 has first guide rails 37a and a second guide rail 37b. The first guide rails 37a are arranged parallel to each other and opposed to each other across the two cups 33 arranged sideways. The second guide rail 37b is slidably supported by the two first guide rails 37a and disposed above the two cups 33. The gripper 36 is slidably supported by the second guide rail 37b. The first guide rails 37a and second guide rail 37b take guiding action substantially horizontally and in directions substantially perpendicular to each other. The nozzle moving mechanism 37 further includes drive members (not shown) for sliding the second guide rail 37b, and sliding the gripper 36. The drive members are operable to move the nozzle 35 gripped by the gripper 36 to the treating positions above the two spin holders 32.

The plurality of heat-treating units 41 are arranged vertically and horizontally, each facing the transporting space $A_1$. In this embodiment, three heat-treating units 41 can be arranged horizontally, and five heat-treating units 41 can be stacked vertically. Each heat-treating unit 41 has a plate 43 for receiving a wafer W. The heat-treating units 41 include cooling units CP for cooling wafers W, heating and cooling units PHP for carrying out heating and cooling treatments continually, and adhesion units AHL for heat-treating wafers W in an atmosphere of hexamethyldisilazane (HMDS) vapor in order to promote adhesion of coating film to the wafers W. As shown in FIG. 5, each heating and cooling unit PHP has two plates 43, and a local transport mechanism (not shown) for moving a wafer W between the two plates 43. The various types of heat-treating units CP, PHP and AHL are arranged in appropriate positions. In this specification, the treatment carried out in the heating and cooling units PHP is referred to as heating and cooling treatment as appropriate.

Figure 11:
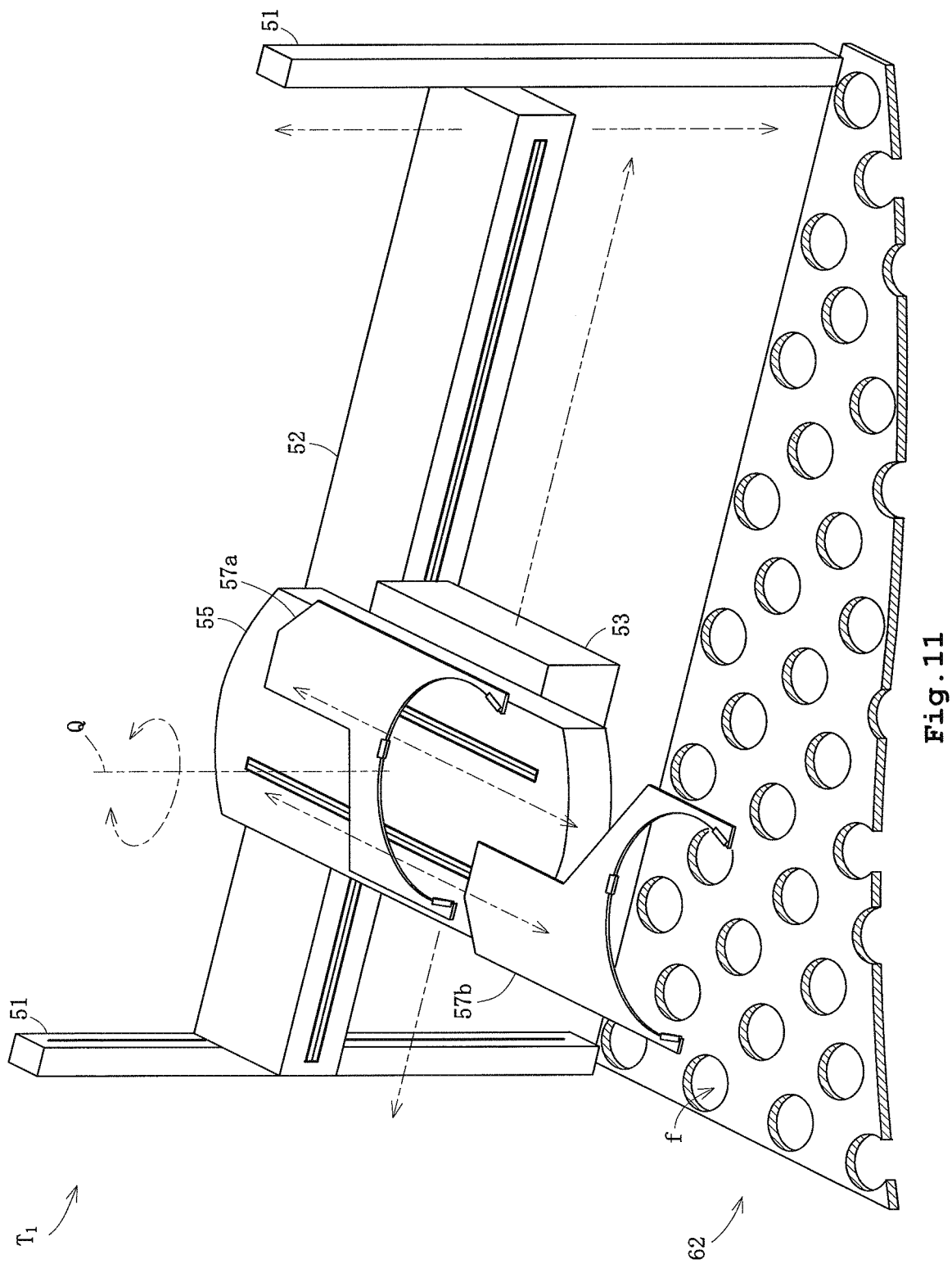
FIG. 11 is a perspective view of a main transport mechanism.

The main transport mechanism $T_1$ will be described specifically. Reference is made to FIG. 11. FIG. 11 is a perspective view of the main transport mechanism $T_1$. The main transport mechanism $T_1$ has two third guide rails 51 for providing vertical guidance, and a fourth guide rail 52 for providing horizontal guidance. The third guide rails 51 are fixed opposite each other at one side of the transporting space A1. In this embodiment, the third guide rails 51 are arranged at the side adjacent the coating units 31. The fourth guide rail 52 is slidably attached to the third guide rails 51. The fourth guide rail 52 has a base 53 slidably attached thereto. The base 53 extends transversely, substantially to the center of the transporting space A1. The main transport mechanism $T_1$ further includes drive members (not shown) for vertically moving the fourth guide rail 52, and horizontally moving the base 53. The drive members are operable to move the base 53 to positions for accessing the coating units 31 and heat-treating units 41 arranged vertically and horizontally.

The base 53 has a turntable 55 rotatable about a vertical axis Q. The turntable 55 has two holding arms 57a and 57b horizontally movably attached thereto for holding wafers W, respectively. The two holding arms 57a and 57b are arranged vertically close to each other. Further, drive members (not shown) are provided for rotating the turntable 55, and moving the holding arms 57a and 57b. The drive members are operable to move the turntable 55 to positions opposed to the coating units 31, heat-treating units 41 and receivers $PASS_1$ and $PASS_2$, and to extend and retract the holding arms 57a and 57b to and from the coating units 31 and so on.

The story K3 will be described next. Like reference numerals are used to identify like parts which are the same as in the story K1, and will not be described again. The layout (arrangement) in plan view of the main transport mechanism $T_3$ and treating units in the story K3 is substantially the same as in the story K1. Thus, the arrangement of the various treating units of the story K3 as seen from the main transport mechanism $T_3$ is substantially the same as the arrangement of the various treating units of the story K1 as seen from the main transport mechanism $T_1$. The coating units 31 and heat-treating units 41 of the story K3 are stacked under the coating units 31 and heat-treating units 41 of the story K1, respectively.

In the following description, when distinguishing the resist film coating units RESIST in the stories K1 and K3, subscripts "1" and "3" will be affixed (for example, the resist film coating units RESIST in the story K1 will be referred to as "resist film coating units $RESIST_1$").

Figure 7:
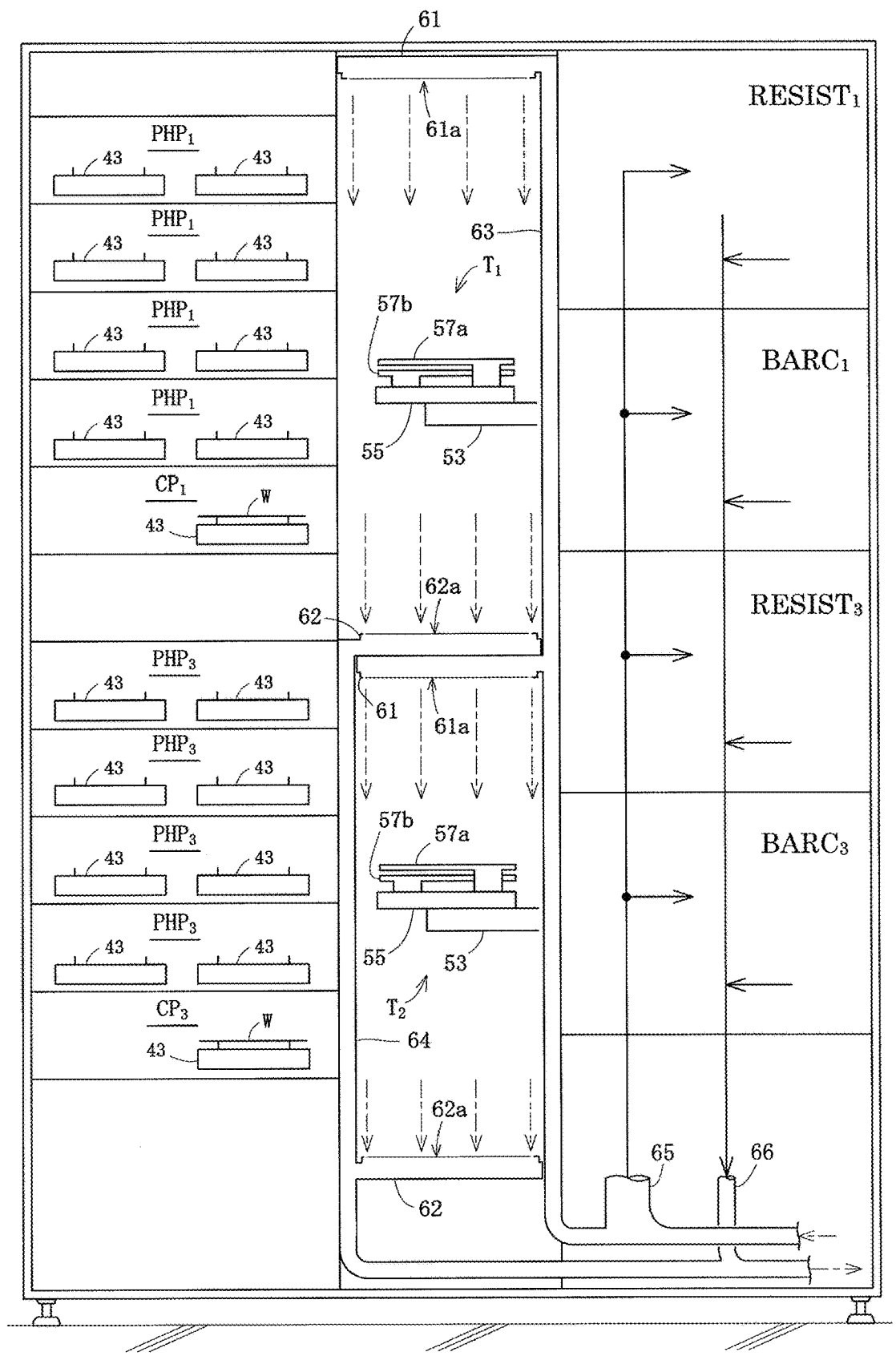
FIG. 7 is a view in vertical section taken on line b-b of FIG. 3.

The other aspects of the treating block Ba will be described. As shown in FIGS. 6 and 7, each of the transporting spaces $A_1$ and $A_3$ has a first blowout unit 61 for blowing out a clean gas, and an exhaust unit 62 for sucking the gas. Each of the first blowout unit 61 and exhaust unit 62 is in the form of a flat box having substantially the same area as the transporting space $A_1$ in plan view. Each of the first blowout unit 61 and exhaust unit 62 has first blowout openings 61a or exhaust openings 62a formed in one surface thereof. In this embodiment, the first blowout openings 61a or exhaust openings 62a are in the form of numerous small bores f (see FIG. 11). The first blowout units 61 are arranged over the transporting spaces $A_1$ and $A_3$ with the first blowout openings 61a directed downward. The exhaust units 62 are arranged under the transporting spaces $A_1$ and $A_3$ with the exhaust openings 62a directed upward. The atmosphere in the transporting space $A_1$ and the atmosphere in the transporting space $A_3$ are blocked off by the exhaust unit 62 of the transporting space $A_1$ and the first blowout unit 61 of the transporting space $A_3$. Thus, each of the stories K1 and K3 has the atmosphere blocked off from the other.

Referring to FIG. 7, the first blowout units 61 of the transporting spaces $A_1$ and $A_3$ are connected to a common, first gas supply pipe 63. The first gas supply pipe 63 extends laterally of the receivers $PASS_2$ and $PASS_4$ from an upper position of the transporting space $A_1$ to a lower position of the transporting space $A_3$, and is bent below the transporting space $A_3$ to extend horizontally. The other end of the first gas supply pipe 63 is connected to a gas source not shown. Similarly, the exhaust units 62 of the transporting spaces $A_1$ and $A_3$ are connected to a common, first gas exhaust pipe 64. The first gas exhaust pipe 64 extends laterally of the receivers $PASS_2$ and $PASS_4$ from a lower position of the transporting space $A_1$ to a lower position of the transporting space $A_3$, and is bent below the transporting space A2 to extend horizontally. As the gas is blown out of each first blowout opening 61a and sucked and exhausted through each exhaust opening 62a of the transporting spaces A1 and A3, gas currents are formed to flow from top to bottom of the transporting spaces $A_1$ and $A_3$, thereby keeping each of the transporting spaces $A_1$ and $A_3$ in a clean state.

Figure 8:
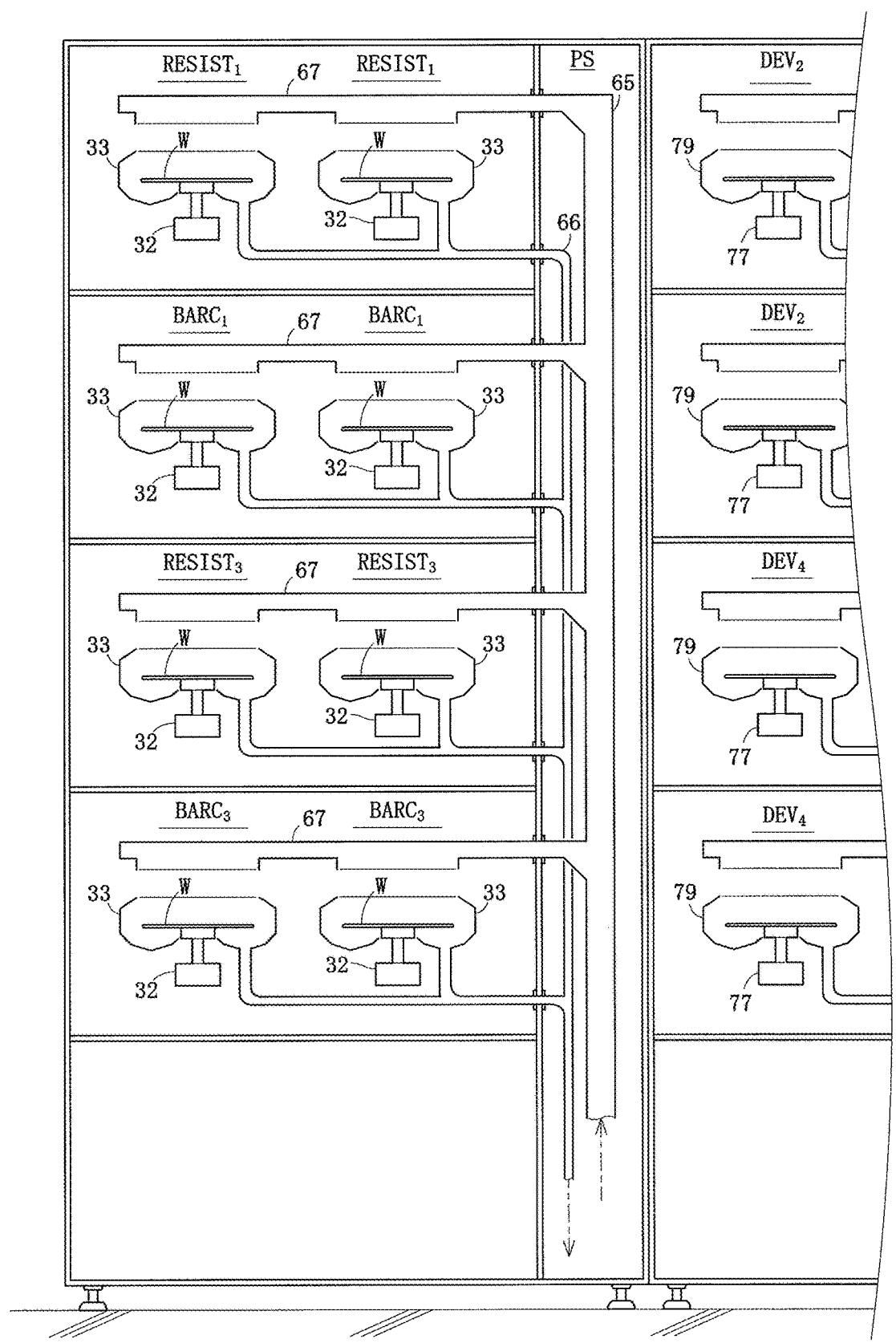
FIG. 8 is a view in vertical section taken on line c-c of FIG. 3.

As shown in FIGS. 3, 8 and 10A, each coating unit 31 of the stories K1 and K3 has a pit portion PS extending vertically. The pit portion PS accommodates a second gas supply pipe 65 extending vertically for supplying the clean gas, and a second gas exhaust pipe 66 extending vertically for exhausting the gas. Each of the second gas supply pipe 65 and second gas exhaust pipe 66 branches at a predetermined height in each coating unit 31 to extend substantially horizontally from the pit portion PS. A plurality of branches of the second gas supply pipe 65 are connected to second blowout units 67 for blowing out the gas downward. A plurality of branches of the second gas exhaust pipe 66 are connected for communication to the bottoms of the respective cups 33. The other end of the second gas supply pipe 65 is connected to the first gas supply pipe 63 below the story K3. The other end of the second gas exhaust pipe 66 is connected to the first gas exhaust pipe 64 below the story K3. As the gas is blown out of the second blowout units 67 and exhausted through the second exhaust pipes 62a, the atmosphere inside each cup 33 is constantly maintained clean, thereby allowing for excellent treatment of the wafer W held by the spin holder 32.

The pit portions PS further accommodate piping of the treating solutions, electric wiring and the like (not shown). Thus, with the pit portions PS accommodating the piping and electric wiring provided for the coating units 31 of the stories K1 and K3, the piping and electric wiring can be reduced in length.

The treating block Ba has one housing 75 for accommodating the main transport mechanisms $T_1$ and $T_3$, coating units 31 and heat-treating units 41 described hereinbefore. The treating block Bb described hereinafter also has a housing 75 for accommodating the main transport mechanisms $T_2$ and $T_4$ and the treating units of the treating block Bb. The housing 75 of the treating block Ba and the housing 75 of the treating block Bb are separate entities. Thus, with each of the treating blocks Ba and Bb having the housing 75 accommodating the main transport mechanisms T and treating units en bloc, the treating section 3 may be manufactured and assembled simply. The treating block Ba corresponds to the coating block in this invention.

Treating Section 3—Treating Block Bb

The story K2 will be described. Like reference numerals are used to identify like parts which are the same as in the story K1 and will not be described again. The story K2 has a transporting space $A_2$ formed as an extension of the transporting space $A_1$.

The story K2 has developing units DEV for developing wafers W, heat-treating units 42 for heat-treating the wafers W, and an edge exposing unit EEW for exposing peripheral regions of the wafers W. The developing units DEV are arranged at one side of the transporting space $A_2$, and the heat-treating units 42 and edge exposing unit EEW are arranged at the other side of the transporting space $A_2$. Preferably, the developing units DEV are arranged at the same side as the coating units 31. It is also preferable that the heat-treating units 42 and edge exposing unit EEW are arranged in the same row as the heat-treating units 41. In this specification, the treatment carried out in the developing units DEV is referred to as developing treatment as appropriate, and the treatment carried out in the edge exposing unit EEW is referred to as edge exposure as appropriate.

The number of developing units DEV is four, and sets of two units DEV arranged horizontally along the transporting space $A_2$ are stacked one over the other. As shown in FIGS. 3 and 8, each developing unit DEV includes a spin holder 77 for holding and spinning a wafer W, and a cup 79 surrounding the wafer W. The two developing units DEV arranged at the lower level are not separated from each other by a partition wall or the like. A supply device 81 is provided for supplying developers to the two developing units DEV. The supply device 81 includes two slit nozzles 81a having a slit or a row of small bores for delivering the developers. The slit or row of small bores, preferably, has a length corresponding to the diameter of wafer W. Preferably, the two slit nozzles 81a are arranged to deliver developers of different types or concentrations. The supply device 81 further includes a moving mechanism 81b for moving each slit nozzle 81a.

Thus, the slit nozzles 81a are movable, respectively, over the two spin holders 77 juxtaposed sideways.

The plurality of heat-treating units 42 are arranged sideways along the transporting space $A_2$, and stacked one over the other. The heat-treating units 42 include heating units HP for heating wafers W, cooling units CP for cooling wafers W, and heating and cooling units PHP for carrying out heating and cooling treatment.

The plurality of heating and cooling units PHP are vertically stacked in the column closest to the IF section 5, each having one side facing the IF section 5. The heating and cooling units PHP on the story K2 have transport ports formed in the sides thereof for passage of wafers W. IF transport mechanisms $T_{IF}$ to be described hereinafter transports wafers W through the above transport ports to the heating and cooling units PHP. The heating and cooling units PHP arranged on the story K2 carry out post-exposure baking (PEB) treatment. Thus, the heating and cooling treatment carried out in the heating and cooling units PHP on the story K2 is referred to herein as PEB treatment in particular. Similarly, the heating and cooling treatment carried out in the heating and cooling units PHP on the story K4 is referred to herein as PEB treatment in particular.

The single edge exposing unit EEW is disposed in a predetermined position. The edge exposing unit EEW includes a spin holder (not shown) for holding and spinning a wafer W, and a light emitter (not shown) for exposing edges of the wafer W held by the spin holder.

The receiver $PASS_5$ is formed on top of the heating and cooling units PHP. The main transport mechanism $T_2$ and IF transport mechanisms $T_{IF}$ to be described hereinafter transfer wafers W through the receiver $PASS_5$.

The main transport mechanism $T_2$ is disposed substantially centrally of the transporting space $A_2$ in plan view. The main transport mechanism $T_2$ has the same construction as the main transport mechanism $T_1$. The main transport mechanism $T_2$ transports wafers W to and from the receiver $PASS_2$, various heat-treating units 42, edge exposing unit EEW and receiver $PASS_5$.

The story K4 will be described briefly. The relationship in construction between story K2 and story K4 is similar to that between stories K1 and K3. The treating units on the story K4 are developing units DEV, heat-treating units 42 and an edge exposing unit EEW. The heat-treating units 42 on the story K4 include heating units HP, cooling units CP and heating and cooling units PHP. The receiver $PASS_6$ is formed on top of the heating and cooling units PHP on the story K4. The main transport mechanism $T_4$ and IF transport mechanisms $T_{IF}$ described hereinafter transfer wafers W through the receiver $PASS_6$. The heating and cooling units PHP arranged on the story K4 also carry out post-exposure baking (PEB) treatment.

In the following description, when distinguishing the developing units DEV, edge exposing units EEW and so on provided on the stories K2 and K4, subscripts "2" and "4" will be affixed (for example, the heating units HP on the story K2 will be referred to as "heating units $HP_2$").

Each of the transporting spaces $A_2$ and $A_4$ of the stories K2 and K4 also has constructions corresponding to the first blowout unit 61 and exhaust unit 62. Each developing unit DEV of the stories K2 and K4 also has constructions corresponding to the second blowout unit 67 and second gas exhaust pipe 66. The treating block Bb corresponds also to the developing block in this invention.

IF Section 5

The IF section 5 transfers wafers W between each of the substrate treatment lines Lu and Ld (stories K2 and K4) of the treating section 3 and the exposing machine EXP. The IF section 5 has IF transport mechanisms $T_{IF}$ for transporting wafers W. The IF transport mechanisms $T_{IF}$ include a first transport mechanism $T_{IFA}$ and a second transport mechanism $T_{IFB}$ that can transfer wafers W to and from each other. The first transport mechanism $T_{IFA}$ transports wafers W to and from the substrate treatment lines Lu and Ld. In this embodiment, as described hereinbefore, the first transport mechanism $T_{IFA}$ transports wafers W to and from the receivers $PASS_5$ and $PASS_6$ on the stories K2 and K4, and to and from the heating and cooling units PHP on the stories K3 and K4. The second transport mechanism $T_{IFB}$ transports wafers W to and from the exposing machine EXP.

As shown in FIG. 3, the first transport mechanism $T_{IFA}$ and second transport mechanism $T_{IFB}$ are arranged in a transverse direction perpendicular to the transport direction of the substrate treatment lines L. The first transport mechanism $T_{IFA}$ is disposed at the side where the heat-treating units 42 and so on of the stories K2 and K4 are located. The second transport mechanism $T_{IFB}$ is disposed at the side where the developing units DEV of the stories K2 and K4 are located. Stacked in multiples stages between the first and second transport mechanisms $T_{IFA}$ and $T_{IFB}$ are a receiver PASS-CP for receiving and cooling wafers W, a receiver $PASS_7$ for receiving wafers W, and buffers BF for temporarily storing wafers W. The first and second transport mechanisms $T_{IFA}$ and $T_{IFB}$ transfer wafers W through the receiver PASS-CP and receiver $PASS_7$. The buffers BF are accessed exclusively by the first transport mechanism $T_{IFA}$.

Figure 9:
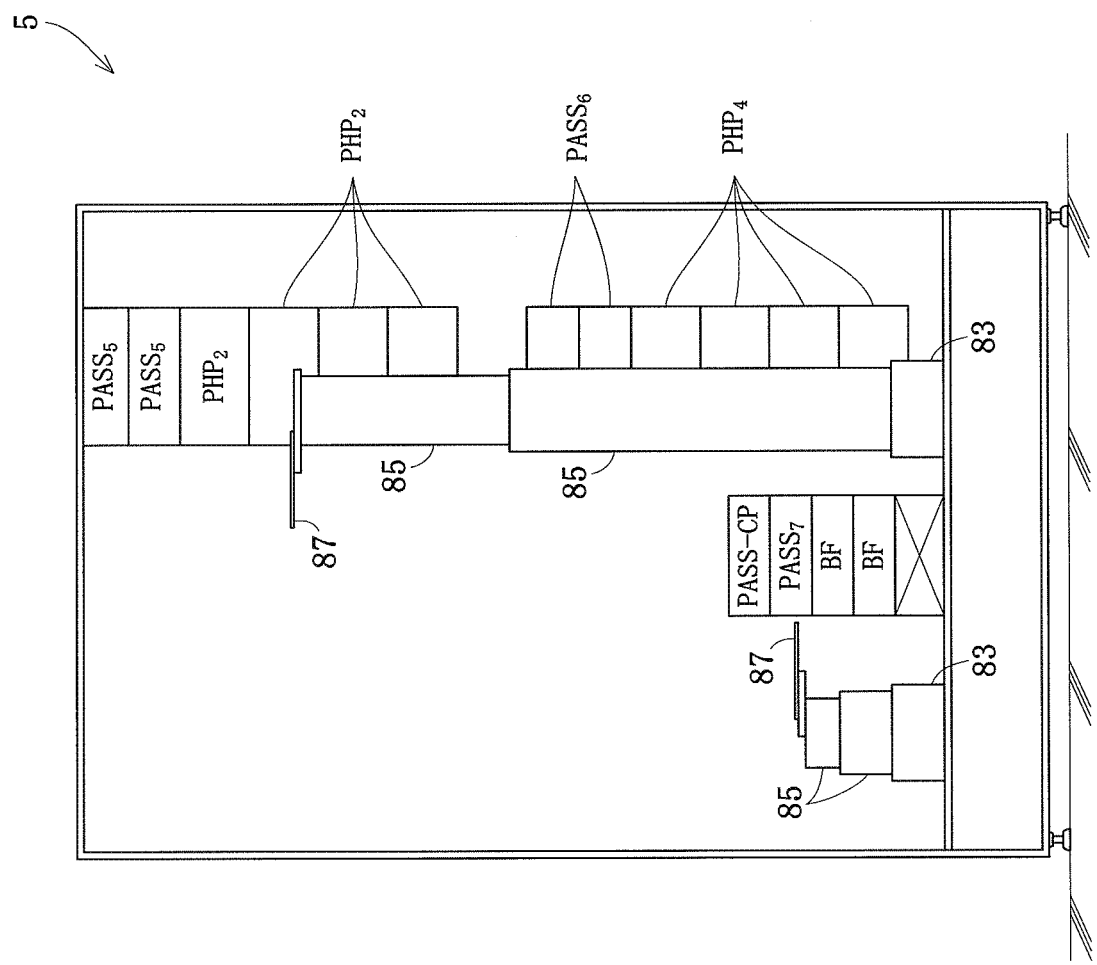
FIG. 9 is a view in vertical section taken on line d-d of FIG. 3.

As shown in FIG. 9, the first transport mechanism $T_{IFA}$ includes a fixed base 83, lift shafts 85 vertically extendible and contractible relative to the base 83, and a holding arm 87 swivelable on the lift shafts 85, and extendible and retractable radially of the swivel motion, for holding a wafer W. The second transport mechanism $T_{IFB}$ also has a base 83, lift shafts 85 and a holding arm 87.

Figure 12:
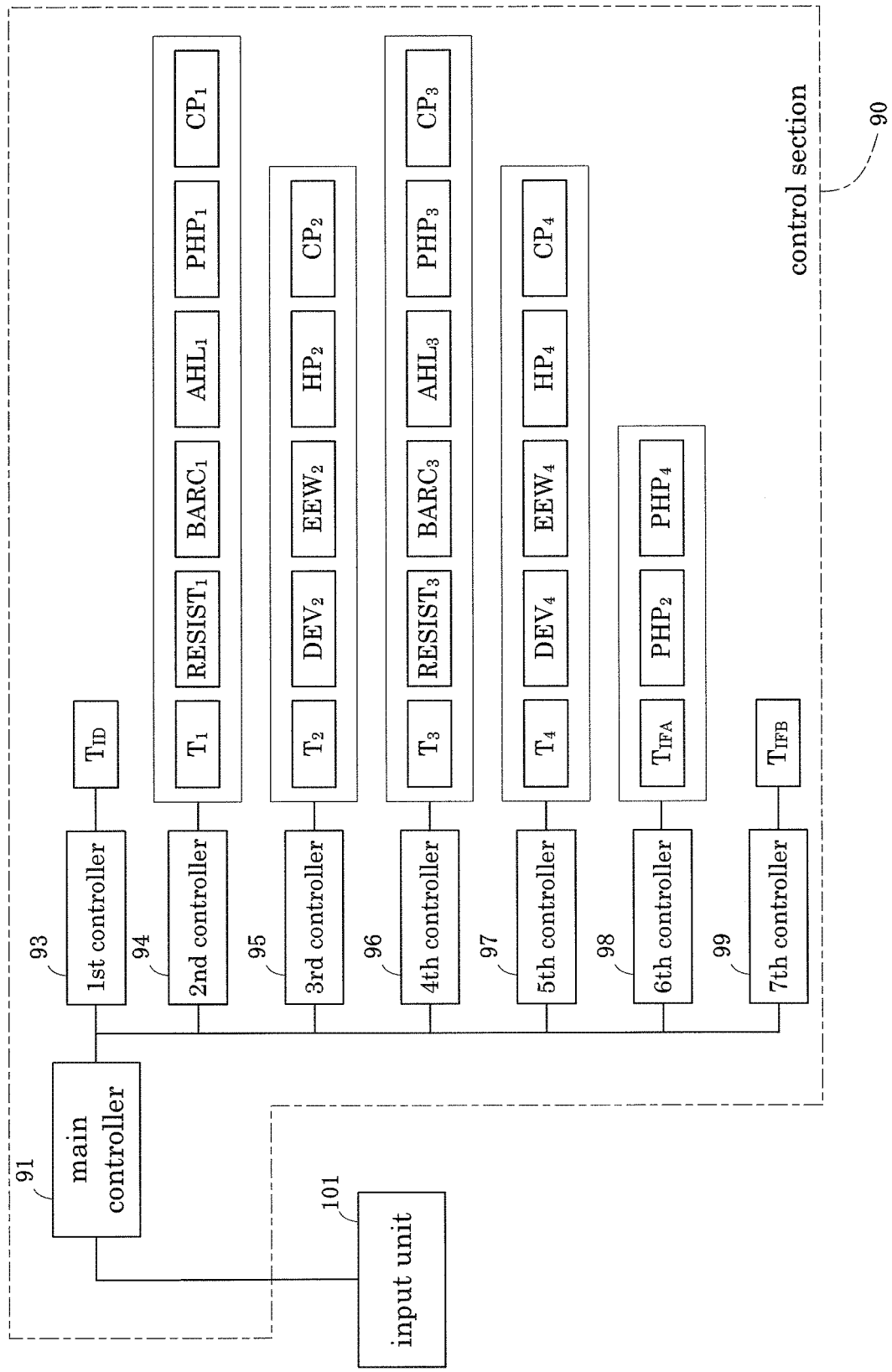
FIG. 12 is a control block diagram of the substrate treating apparatus according to the invention.

A control system of this apparatus 10 will be described next. This apparatus 10 further includes a control section 90 and an input unit 101. FIG. 12 is a control block diagram of the substrate treating apparatus according to the invention.

The input unit 101 is operable to input information for setting substrate transport paths for each of the substrate treatment lines Lu and Ld. The information inputted to this input unit 101 is outputted to a main controller 91. The information for setting substrate transport paths for each story includes the types and order of treating units to/in which substrates are to be transported, for example. Or, it is information identifying treating units or particulars of treatment for which a test run is made. The information for setting transport paths for the substrate treatment line Lu may be divided into each transport path for the stories K1 and K2. This applies also to the substrate treatment line Ld.

The input unit 101 has pointing devices represented by a mouse, keyboard, joystick, trackball, touch panel, and so on.

As shown in FIG. 12, the control section 90 includes a main controller 91 and a first to a seventh controllers 93, 94, 95, 96, 97, 98 and 99. The main controller 91 performs overall control of the first to seventh controllers 93-99. Based on a treating recipe set beforehand and/or information inputted to the input unit 101, the main controller 91 controls the main transport mechanisms T through the first to seventh controllers 93-99, to change the transport paths for each story K.

For example, based on information on the types and order of treating units to/in which substrates are to be transported, the main controller 91 determines treating units and their order to/in which wafers W are transported, and also determines transport paths linking the treating units. Alternatively, based on information identifying treating units put to a test run, the main controller 91 determines transport paths for transporting wafers W only to the treating units identified.

The first controller 93 controls substrate transport by the ID transport mechanism $T_{ID}$. The second controller 94 controls substrate transport by the main transport mechanism $T_1$, and substrate treatment in the resist film coating units $RESIST_1$, antireflection film coating units $BARC_1$, cooling units $CP_1$, heating and cooling units $PHP_1$ and adhesion units $AHL_1$. The third controller 95 controls substrate transport by the main transport mechanism $T_2$, and substrate treatment in the edge exposing unit $EEW_2$, developing units $DEV_2$, heating units $HP_2$ and cooling units $CP_2$. The controls by the fourth and fifth controllers 96 and 97 correspond to those by the second and third controllers 94 and 95, respectively. The sixth controller 98 controls substrate transport by the first transport mechanism $T_{IFA}$, and substrate treatment in the heating and cooling units $PHP_2$ and $PHP_4$. The seventh controller 99 controls substrate transport by the second transport mechanism $T_{IFB}$. The first to seventh controllers 93-99 carry out the controls independently of one another.

Each of the main controller 91 and the first to seventh controllers 93-99 is realized by a central processing unit (CPU) which performs various processes, a RAM (Random Access Memory) used as the workspace for operation processes, and a storage medium such as a fixed disk for storing a variety of information including a predetermined processing recipe (processing program).

Next, operation of the substrate treating apparatus in this embodiment will be described separately for the case where wafers W go through the same process of treatment in the substrate treatment lines Lu and Ld, and for the case where wafers W go through different processes of treatment in the substrate treatment lines Lu and Ld. In each example of operation, the transport paths of wafers W are based on information inputted to the input unit 101 by the operator beforehand.

Figure 13:
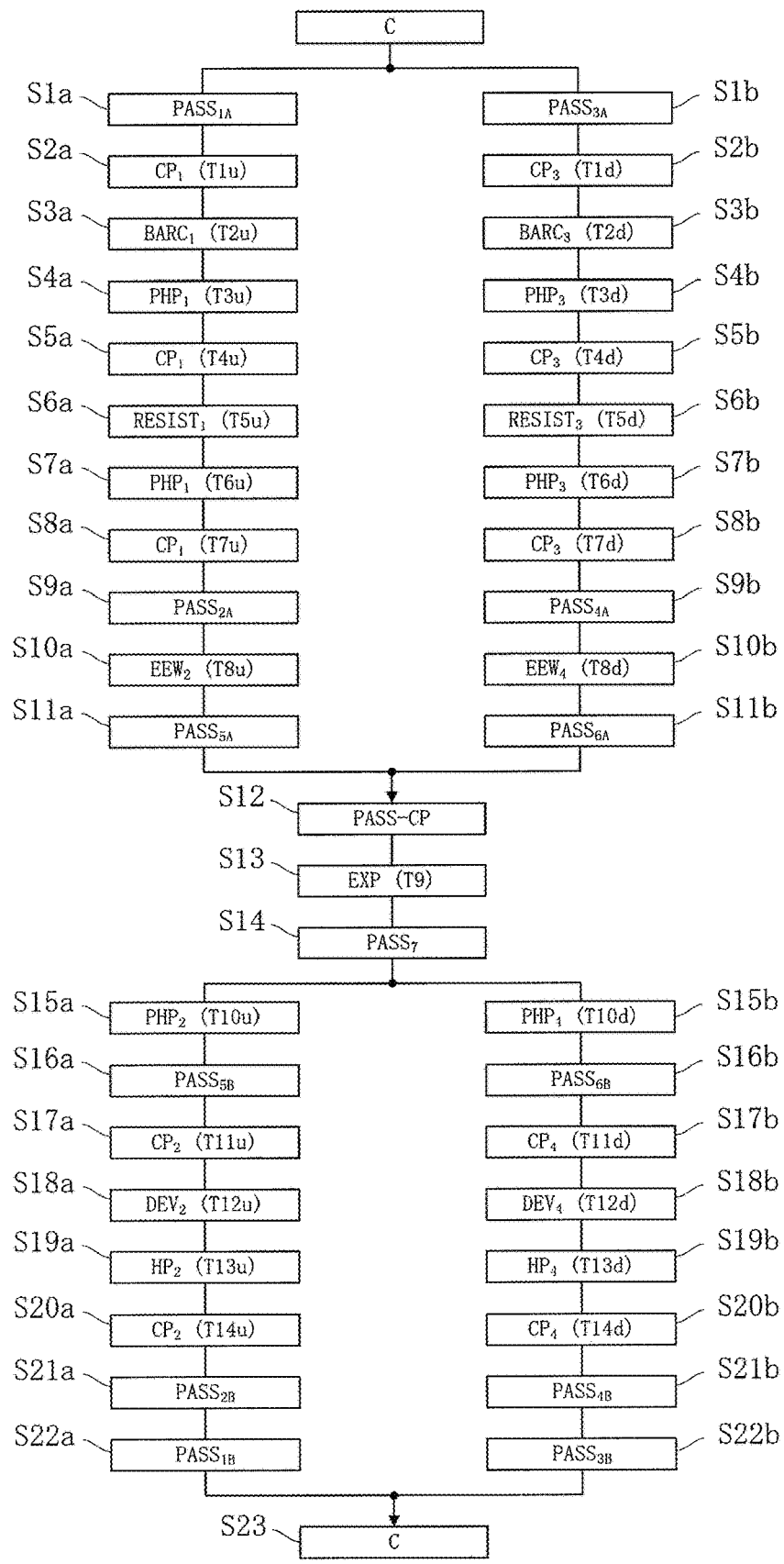
FIG. 13 is a flow chart of a series of treatments of substrates.
Figure 14:
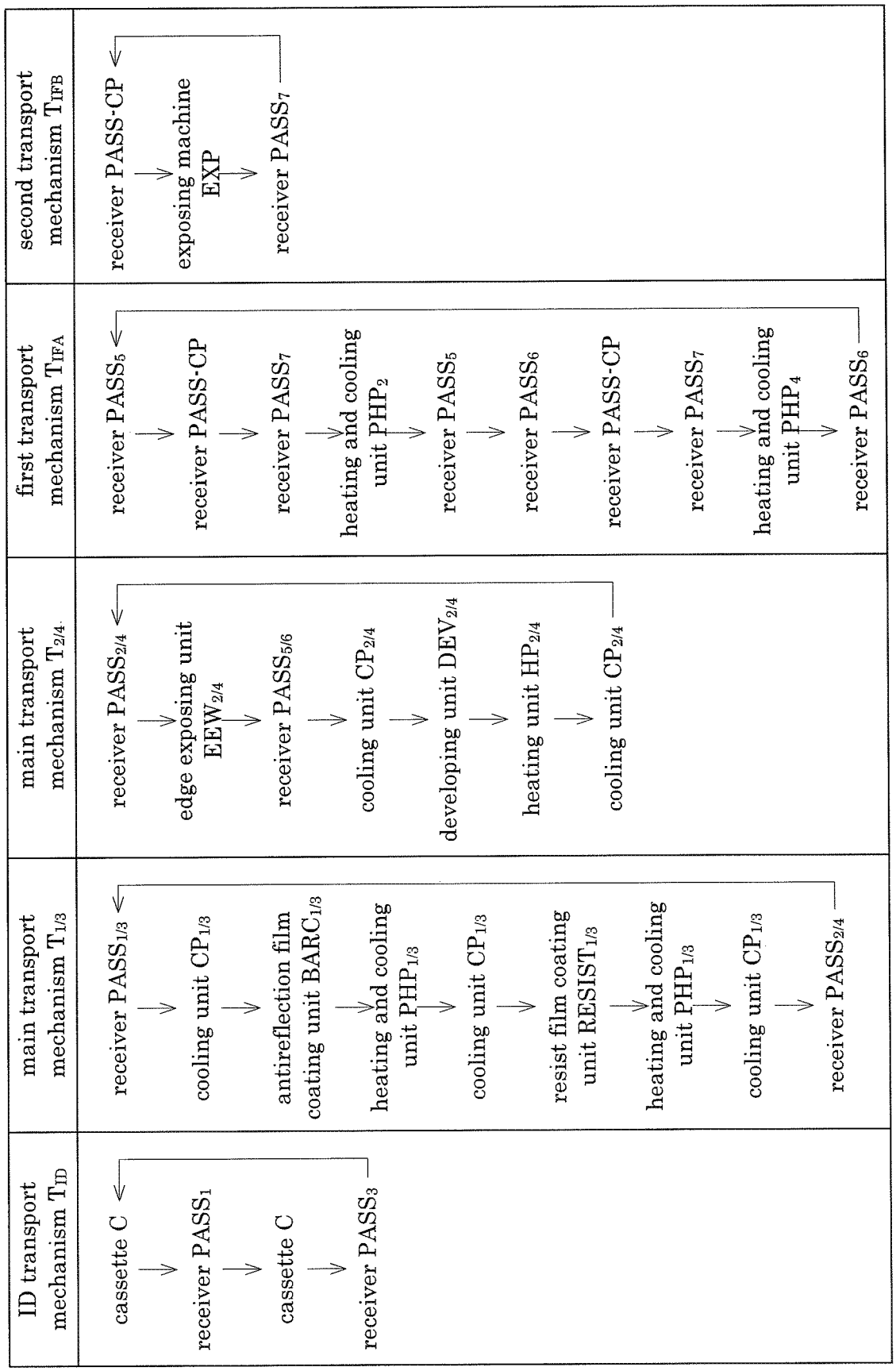
FIG. 14 is a view schematically showing operations repeated by each transport mechanism.

Example of Operation 1—where Wafers W go Through the Same Process of Treatment in the Substrate Treatment Lines Lu and Ld FIG. 13 is a flow chart of a series of treatments of wafers W, indicating transport paths of wafers W, that is the treating units and receivers to which the wafers W are transported in order. The flow chart shown in FIG. 13 corresponds to the processes shown in FIG. 1. For expediency, the various processes shown in FIG. 1 are put in parentheses in FIG. 13, to specify the correspondence relations between the various processes shown in FIG. 1 and the treating units shown in FIG. 13. FIG. 14 is a view schematically showing operations repeated by each transport mechanism, and specifying an order of treating units, receivers and cassettes accessed by the transport mechanisms.

The control section 90 operates each transport mechanism T based on a treating recipe set beforehand and/or information inputted to the input unit 101. The following description will be made separately for each transport mechanism.

ID Transport Mechanism $T_{ID}$

The ID transport mechanism $T_{ID}$ moves to a position opposed to one of the cassettes C, holds with the holding arm 25 a wafer W to be treated and takes the wafer W out of the cassette C. The ID transport mechanism $T_{ID}$ swivels the holding arm 25, vertically moves the lift shaft 23, moves to a position opposed to the receiver $PASS_1$, and places the wafer W on the receiver $PASS_{1A}$ (which corresponds to step S1*a* in FIG. 13; only step references will be indicated hereinafter). At this time, a wafer W usually is present on the receiver $PASS_{1B}$, and the ID transport mechanism $T_{ID}$ receives this wafer W and stores it in a cassette C (step S23). When there is no wafer W on the receiver $PASS_{1B}$, step S23 is omitted. Then, the ID transport mechanism $T_{ID}$ accesses the cassette C, and transports a wafer W from the cassette C to the receiver $PASS_{3A}$ (step S1*b*). Here again, if a wafer W is present on the receiver $PASS_{3B}$, the ID transport mechanism $T_{ID}$ will store this wafer W in a cassette C (step S23). The ID transport mechanism $T_{ID}$ repeats the above operation.

This operation of the ID transport mechanism $T_{ID}$ is controlled by the first controller 93. As a result, the wafers W in the cassette C are fed to the story K1, and the wafers W delivered from the story K1 are stored in the cassette C. Similarly, the wafers W in the cassette C are fed to the story K3, and the wafers W delivered from the story K3 are stored in the cassette C.

Main Transport Mechanisms $T_1$, $T_3$

Since operation of the main transport mechanism $T_3$ is substantially the same as operation of the main transport mechanism $T_1$, only the main transport mechanism $T_1$ will be described. The main transport mechanism $T_1$ moves to a position opposed to the receiver $PASS_1$. At this time, the main transport mechanism $T_1$ holds, on one holding arm 57 (e.g. 57*b*), a wafer W received immediately before from the receiver $PASS_{2B}$. The main transport mechanism $T_1$ places this wafer W on the receiver $PASS_{1B}$ (step S22), and holds the wafer W present on the receiver $PASS_{1A}$ with the other holding arm 57 (e.g. 57*a*).

The main transport mechanism $T_1$ accesses one of the cooling units $CP_1$. There is a different wafer W having already received cooling treatment in the cooling unit $CP_1$. The main transport mechanism $T_1$ holds the different wafer W with the unloaded holding arm 57 (holding no wafer W), takes it out of the cooling unit $CP_1$, and loads into the cooling unit $CP_1$ the wafer W having received from the receiver $PASS_{1A}$. Then, the main transport mechanism $T_1$, holding the cooled wafer W, moves to one of the antireflection film coating units $BARC_1$. The cooling unit $CP_1$ starts cooling treatment of the wafer W loaded therein (step S2: the treatment in step S2 by the cooling unit $CP_1$ corresponds to cooling treatment T1*u* in FIG. 1—only treatment shown in FIG. 1 will be indicated hereinafter as appropriate). This heat treatment (cooling) will have been finished by the time the main transport mechanism $T_1$ accesses this cooling unit $CP_1$ next time. The following description assumes that wafers W having received predetermined treatments are present also in the other, different heat-treating units 41 and coating units 31 when the main transport mechanism $T_1$ makes access thereto.

Accessing the antireflection film coating unit $BARC_1$, the main transport mechanism $T_1$ takes a wafer W having antireflection film formed thereon from the antireflection film coating unit $BARC_1$, and places the cooled wafer W on the spin holder 32 of the antireflection film coating unit $BARC_1$. Then, the main transport mechanism $T_1$, holding the wafer W having antireflection film formed thereon, moves to one of the heating and cooling units $PHP_1$. The antireflection film coating unit $BARC_1$ starts antireflection film material coating treatment of the wafer W placed on the spin holder 32 (step S3*a*-antireflection film material coating treatment T2*u*).

Specifically, the spin holder 32 spins the wafer W in horizontal posture, the gripper 26 grips one of the nozzles 35, the nozzle moving mechanism 37 moves the gripped nozzle 35 to a position above the wafer W, and the treating solution for antireflection film is supplied from the nozzle 35 to the wafer W. The treating solution supplied spreads all over the wafer W, and is scattered away from the wafer W. The cup 33 collects the scattering treating solution. In this way, the treatment is carried out for forming antireflection film on the wafer W.

Accessing the heating and cooling unit $PHP_1$, the main transport mechanism $T_1$ takes a wafer W having received heat treatment out of the heating and cooling unit $PHP_1$, and loads the wafer W having antireflection film formed thereon into the heating and cooling unit $PHP_1$. Then, the main transport mechanism $T_1$, holding the wafer W taken out of the heating and cooling unit $PHP_1$, moves to one of the cooling units $CP_1$. The heating and cooling unit $PHP_1$ receives a wafer W successively on the two plates 43, to heat the wafer W on one of the plates 43 and then to cool the wafer W on the other plate 43 (step S4a—heating and cooling treatment T3u).

Having moved to the cooling unit $CP_1$, the main transport mechanism $T_1$ takes a wafer W out of the cooling unit $CP_1$, and loads the wafer W held by the transport mechanism $T_1$ into the cooling unit $CP_1$. The cooling unit $CP_1$ cools the wafer W loaded therein (step S5a—cooling treatment T4u).

Then, the main transport mechanism $T_1$ moves to one of the resist film coating units $RESIST_1$. The main transport mechanism $T_1$ takes a wafer W having resist film formed thereon from the resist film coating unit $RESIST_1$, and loads the wafer W held by the main transport mechanism $T_1$ into the resist film coating unit $RESIST_1$. The resist film coating unit $RESIST_1$ coats the resist film material on the wafer W loaded therein while spinning the wafer W (step S6a—resist film material coating treatment T5u).

The main transport mechanism $T_1$ further moves to one of the heating and cooling units $PHP_1$ and one of the cooling units $CP_1$. The main transport mechanism $T_1$ loads the wafer W having resist film formed thereon into the heating and cooling unit $PHP_1$, transfers a wafer W treated in the heating and cooling unit $PHP_1$ to the cooling unit $CP_1$, and receives a wafer W treated in the cooling unit $CP_1$. The heating and cooling unit $PHP_1$ and cooling unit $CP_1$ carry out predetermined treatments of newly loaded wafers W, respectively (step S7a—heating and cooling treatment T6u, and S8a—cooling treatment T7u).

The main transport mechanism $T_1$ moves to the receiver $PASS_2$, places the wafer W it is holding on the receiver $PASS_{2A}$ (step S9a), and receives a wafer W present on the receiver $PASS_{2B}$ (step S21a).

Subsequently, the main transport mechanism $T_1$ accesses the receiver $PASS_1$ again, and repeats the above operation. This operation is controlled by the second controller 94. As a result, all the wafers W transported from the cassette C to the receiver $PASS_1$ are transported through the transport paths described above between the various treating units on the story K1 to receive the predetermined treatments in the treating units successively.

The main transport mechanism $T_1$ transports a wafer W having been transported to the receiver $PASS_1$ to a predetermined treating unit (a cooling unit $CP_1$ in this embodiment), and takes a treated wafer W from this treating unit. Subsequently, the main transport mechanism $T_1$ transports the wafer W taken out to a next treating unit (an antireflection film coating unit $BARC_1$ in this embodiment), and takes a treated wafer W from this treating unit. In this way, the treatment is carried out in parallel for a plurality of wafers W by transferring a treated wafer W from each treating unit to a new treating unit. Starting with a wafer W first placed on the receiver $PASS_1$, the wafers W are successively placed on the receiver $PASS_2$ to be fed to the story K2. Similarly, the wafers W are placed on the receiver $PASS_1$ in the order of placement on the receiver $PASS_2$, to be fed to the ID section 1.

Main Transport Mechanisms $T_2$, $T_4$

Since operation of the main transport mechanism $T_4$ is substantially the same as operation of the main transport mechanism $T_2$, only the main transport mechanism $T_2$ will be described. The main transport mechanism $T_2$ moves to a position opposed to the receiver $PASS_2$. At this time, the main transport mechanism $T_2$ holds a wafer W received from a cooling unit $CP_2$ accessed immediately before. The main transport mechanism $T_2$ places this wafer W on the receiver $PASS_{2B}$ (step S21a), and holds the wafer W present on the receiver $PASS_{2A}$ (step S9a).

The main transport mechanism $T_2$ accesses the edge exposing unit $EEW_2$. The main transport mechanism $T_2$ receives a wafer W having received a predetermined treatment in the edge exposing unit $EEW_2$, and loads the cooled wafer W into the edge exposing unit $EEW_2$. While spinning the wafer W loaded therein, the edge exposing unit $EEW_2$ irradiates peripheral regions of the wafer W with light from the light emitter not shown, thereby exposing the peripheral regions of the wafer W (step S10a—edge exposure T8u).

The main transport mechanism $T_2$, holding the wafer W received from the edge exposing unit $EEW_2$, accesses the receiver $PASS_5$. The main transport mechanism $T_2$ places the wafer W on the receiver $PASS_{5A}$ (step S11a), and holds a wafer W present on the receiver $PASS_{5B}$ (step S16a).

The main transport mechanism $T_2$ moves to one of the cooling units $CP_2$, and replaces a wafer W in the cooling unit $CP_2$ with the wafer W held by the main transport mechanism $T_2$. The main transport mechanism $T_2$ holds the wafer W having received cooling treatment, and accesses one of the developing units $DEV_2$. The cooling unit $CP_2$ starts treatment of the newly loaded wafer W (step S17a—cooling treatment T1u).

The main transport mechanism $T_2$ takes a developed wafer W from the developing unit $DEV_2$, and places the cooled wafer W on the spin holder 77 of the developing unit $DEV_2$. The developing unit $DEV_2$ develops the wafer W placed on the spin holder 77 (step S18a—developing treatment T12u). Specifically, while the spin holder 77 spins the wafer W in horizontal posture, the developer is supplied from one of the slit nozzles 81a to the wafer W, thereby developing the wafer W.

The main transport mechanism $T_2$ holds the developed wafer W, and accesses one of the heating units $HP_2$. The main transport mechanism $T_2$ takes a wafer W out of the heating unit $HP_2$, and loads the wafer W it is holding into the heating unit $HP_2$. Then, the main transport mechanism $T_2$ transports the wafer W taken out of the heating unit $HP_2$ to one of the cooling units $CP_2$, and takes out a wafer W already treated in this cooling unit $CP_2$. The heating unit $HP_2$ and cooling unit $CP_2$ carry out predetermined treatments for the newly loaded wafers W, respectively (step S19a—heating treatment T13u, and S20a—cooling treatment T14u).

Subsequently, the main transport mechanism $T_2$ accesses the receiver $PASS_2$ again, and repeats the above operation. This operation is controlled by the third controller 95. As a result, the wafers W are forwarded to the receiver $PASS_{5B}$ in the order in which they are placed on the receiver $PASS_{2A}$. Similarly, the wafers W are forwarded to the receiver $PASS_{2B}$ in the order in which they are placed on the receiver $PASS_{5B}$.

IF Transport Mechanisms $T_{IF}$—First Transport Mechanism $T_{IFA}$

The first transport mechanism $T_{IFA}$ accesses the receiver $PASS_5$, and receives the wafer W present on the receiver $PASS_{5A}$ (step S11a). The first transport mechanism $T_{IFA}$, holding the wafer W received, moves to the receiver PASS-CP, and loads the wafer W on the receiver PASS-CP (step S12).

Next, the first transport mechanism $T_{IFA}$ receives a wafer W from the receiver $PASS_7$ (step S14), and moves to a position opposed to one of the heating and cooling units $PHP_2$. The first transport mechanism $T_{IFA}$ takes a wafer W having received PEB treatment from the heating and cooling unit $PHP_2$, and loads the wafer W received from the receiver $PASS_7$ into the heating and cooling unit $PHP_2$. The heating and cooling unit $PHP_2$ carries out heat treatment for the newly loaded wafer W (step S15a—PEB treatment T10u).

The first transport mechanism $T_{IFA}$ transports the wafer W taken out of the heating and cooling unit $PHP_2$ to the receiver $PASS_{5B}$ (step S16a). Subsequently, the first transport mechanism $T_{IFA}$ transports a wafer W from the receiver $PASS_{6A}$ to the receiver PASS-CP (Step S11b, S12). Next, the first transport mechanism $T_{IFA}$ transports a wafer W from the receiver $PASS_7$ to one of the heating and cooling units $PHP_4$. At this time, the first transport mechanism $T_{IFA}$ takes out a wafer W having received the post-exposure baking treatment (PEB) treatment in the heating and cooling unit $PHP_4$, and places the wafer W on the receiver $PASS_{6B}$ (steps S14, S15b—PEB treatment T10d, and 516b).

Subsequently, the first transport mechanism $T_{IFA}$ accesses the receiver $PASS_5$ again and repeats the above operation. This operation is controlled by the sixth controller 98.

IF Transport Mechanisms $T_{IF}$—Second Transport Mechanism $T_{IFB}$

The second transport mechanism $T_{IFB}$ takes a wafer W out of the receiver PASS-CP, and transports it to the exposing machine EXP. The exposing machine EXP exposes the wafer W (Step S13—Exposure T9). Then, the second transport mechanism $T_{IFB}$ receives the exposed wafer W from the exposing machine EXP, and transports it to the receiver $PASS_7$.

Subsequently, the second transport mechanism $T_{IFB}$ accesses the receiver PASS-CP again and repeats the above operation.

Figure 15:
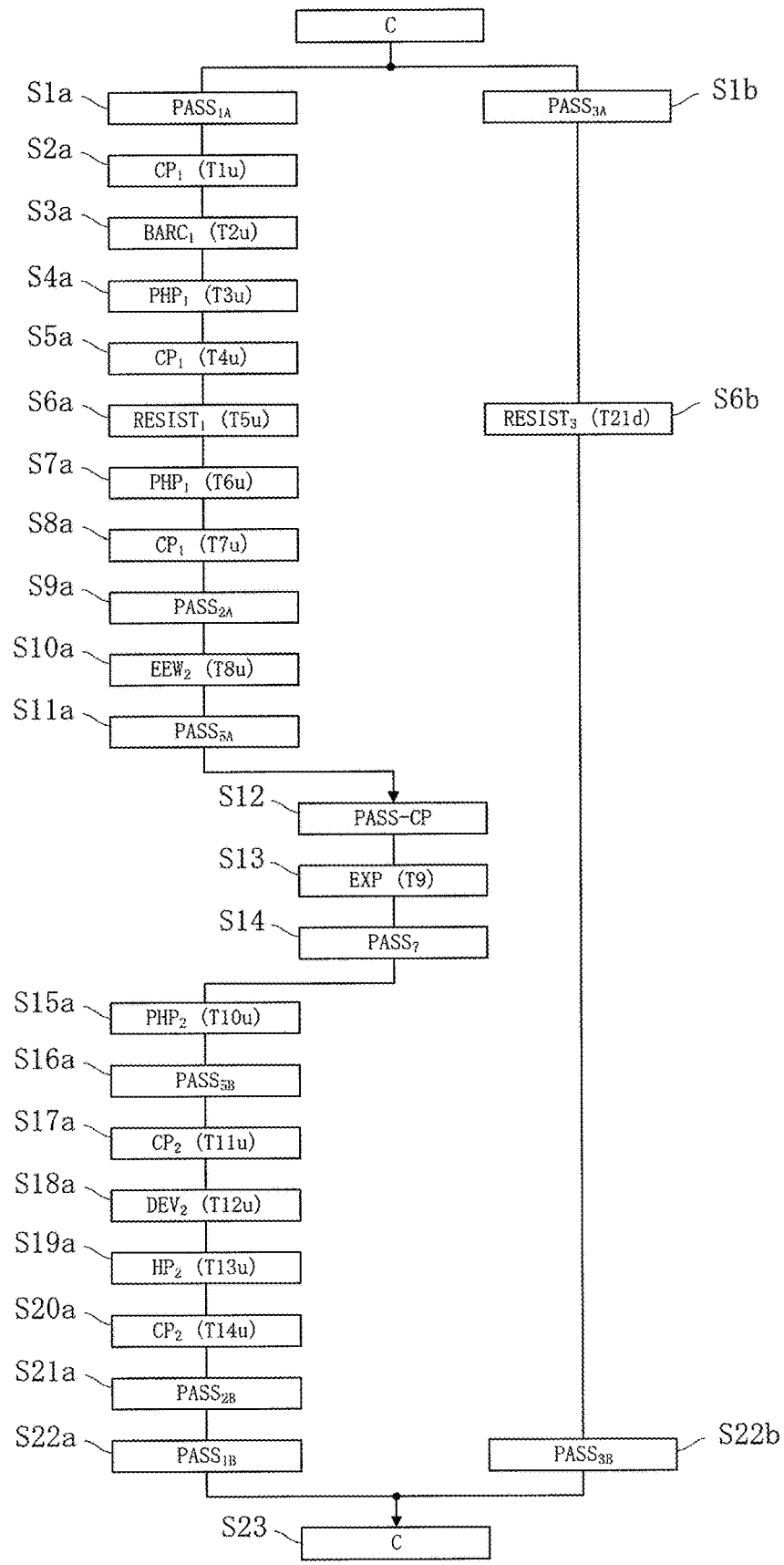
FIG. 15 is a flow chart of a series of treatments of substrates.
Figure 16:
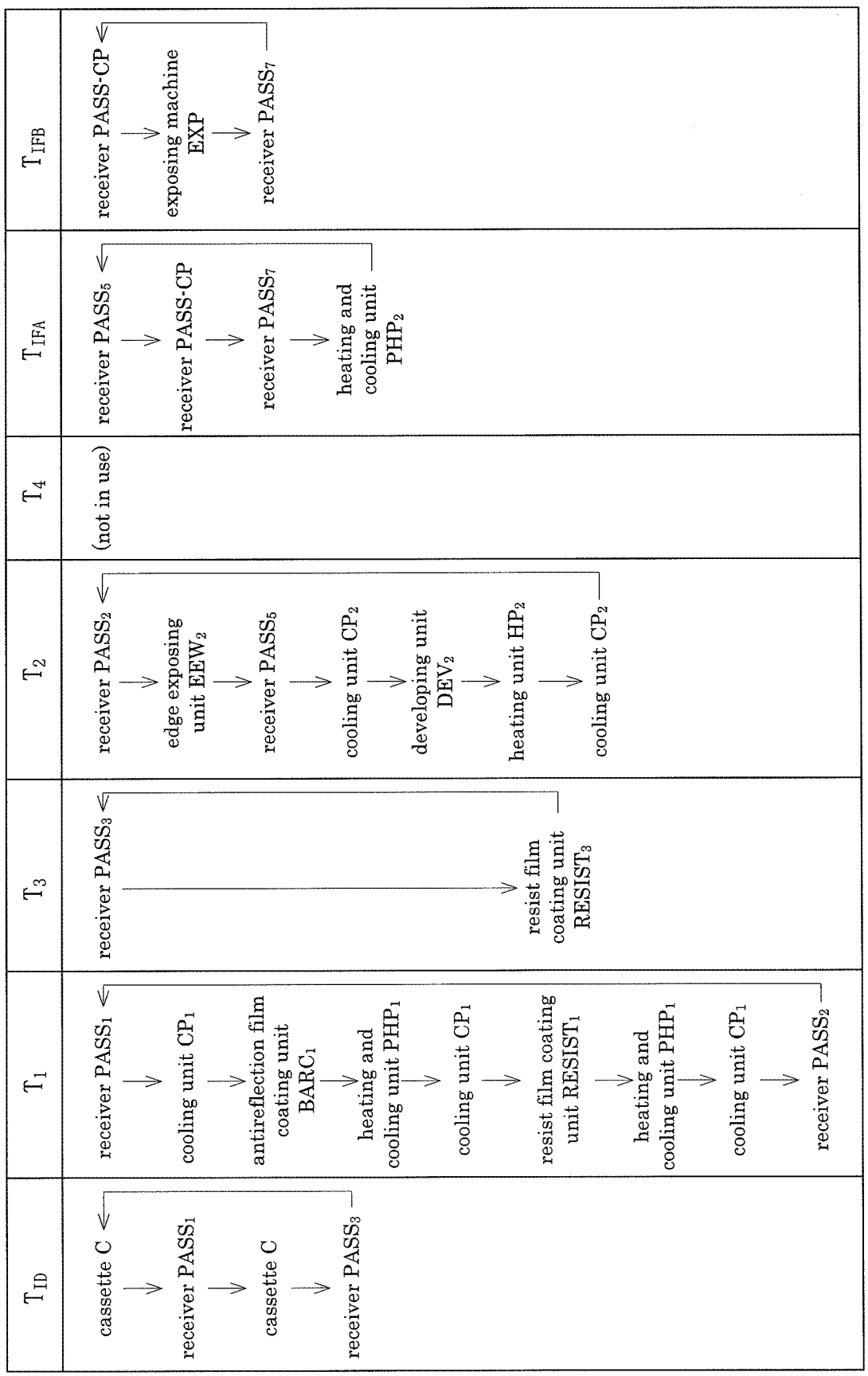
FIG. 16 is a view schematically showing operations repeated by each transport mechanism.

Example of Operation 2—where Wafers W go Through Different Processes of Treatment in the Substrate Treatment Lines Lu and Ld The example of operation 2 will be described next. FIG. 15 is a flow chart of a series of treatments of wafers W, indicating transport paths of wafers W, that is, the treating units and receivers to which the wafers W are transported in order. The flow chart shown in FIG. 15 corresponds to the processes shown in FIG. 2. For expediency, the various processes shown in FIG. 2 are put in parentheses in FIG. 15, to specify the correspondence relations between the various processes shown in FIG. 2 and the treating units shown in FIG. 15. FIG. 16 is a view schematically showing operations repeated by each transport mechanism, and specifying an order of treating units, receivers and cassettes accessed by the transport mechanisms.

The control section 90 operates each transport mechanism T based on a treating recipe set beforehand and/or information inputted to the input unit 101. The following description will be made separately for each transport mechanism. The transport mechanisms and other components that perform similarly to the example of operation 1 will be described briefly as appropriate.

ID Transport Mechanism $T_{ID}$

The operation of ID transport mechanism $T_{ID}$ is the same as in the example of operation 1, and therefore its description is omitted.

Main Transport Mechanisms $T_1$, $T_3$

The operation of the main transport mechanism $T_1$ is the same as in the example of operation 1. Thus, the operation of the main transport mechanism $T_1$ will be omitted, and only the main transport mechanism $T_3$ will be described.

The main transport mechanism $T_3$ moves to a position opposed to the receiver $PASS_3$. At this time, the main transport mechanism $T_3$ holds, on one holding arm 57 (e.g. 57b), a wafer W received immediately before from the receiver $PASS_{4B}$. The main transport mechanism $T_3$ places this wafer W on the receiver $PASS_{3B}$ (step S22b), and holds the wafer W present on the receiver $PASS_{3A}$ with the other holding arm 57 (e.g. 57a) (step S1b).

The main transport mechanism $T_3$ accesses one of the resist film coating units $RESIST_3$. The main transport mechanism $T_3$ takes a wafer W having resist film formed thereon from the resist film coating unit $RESIST_3$, and loads the wafer W held by the main transport mechanism $T_3$ into the resist film coating unit $RESIST_3$. The resist film coating unit $RESIST_3$ coats the resist film material on the wafer W loaded therein while spinning the wafer W (step S6b—resist film material coating treatment T21d).

Subsequently, the main transport mechanism $T_3$ accesses the receiver $PASS_3$ again, and repeats the above operation. This operation is controlled by the fourth controller 96. As a result, all the wafers W transported from the cassette C to the receiver $PASS_3$ are transported through the transport path leading only to the resist film coating unit RESISTS on the story K3.

Main Transport Mechanisms $T_2$, $T_4$

The operation of the main transport mechanism $T_2$ is the same as in the example of operation 1. Thus, the operation of the main transport mechanism $T_2$ will be omitted. The main transport mechanism $T_4$ carries out no operation to transport wafers W. For example, the fifth controller 97 maintains the main transport mechanism $T_4$ at rest.

IF Transport Mechanisms $T_{IF}$—First Transport Mechanism $T_{IFA}$

The first transport mechanism $T_{IFA}$ accesses the receiver $PASS_5$, and receives the wafer W present on the receiver $PASS_{5A}$ (step S11a). The first transport mechanism $T_{IFA}$, holding the wafer W received, moves to the receiver PASS-CP, and loads the wafer W on the receiver PASS-CP (step S12).

Next, the first transport mechanism $T_{IFA}$ receives a wafer W from the receiver $PASS_7$ (step S14), and moves to a position opposed to one of the heating and cooling units $PHP_2$. The first transport mechanism $T_{IFA}$ takes a wafer W having received post-exposure baking treatment (PEB) treatment from the heating and cooling unit $PHP_2$, and loads the wafer W received from the receiver $PASS_7$ into the heating and cooling unit $PHP_2$. The heating and cooling unit $PHP_2$ carries out heat treatment for the newly loaded wafer W (step S15—PEB treatment T10u). The first transport mechanism $T_{IFA}$ transports the wafer W taken out of the heating and cooling unit $PHP_2$ to the receiver $PASS_{5B}$ (step S16a).

Subsequently, the first transport mechanism $T_{IFA}$ accesses the receiver $PASS_5$ again and repeats the above operation.

IF Transport Mechanisms $T_{IF}$—Second Transport Mechanism $T_{IFB}$

The operation of the second transport mechanism $T_{IFB}$ is the same as in the example of operation 1. Thus, the operation of the second transport mechanism $T_{IFB}$ will be omitted.

The above is the example of operation 2. However, the processes in the substrate treatment lines Lu and Ld are not limited to examples of operation 1 and 2. As noted in the foregoing description of the outline of this embodiment, the processes in the substrate treatment lines Lu and Ld can be changed very flexibly. Thus, since the substrate treating apparatus in this embodiment has the control section 90 which changes the processes in the substrate treatment lines Lu and Ld, the substrate treatment lines Lu and Ld can carry out different treatments of wafers W in parallel as described in the example of operation 2. Therefore, by transporting wafers W selectively to the substrate treatment line Lu or Ld, the process of treatment is changeable for each wafer W. Further, as described in the example of operation 1, wafers W can go through the same process of treatment in the substrate treatment lines Lu and Ld. Consequently, this apparatus 10 has an improved substrate throughput.

Specifically, in the example of operation 1, wafers W go through the coating and developing process in all the substrate treatment lines L. This embodiment includes heat treatment besides the resist film material coating treatment and developing treatment. Thus, resist film can be formed on the wafers W conveniently, and the wafers W can be developed conveniently.

In the example of operation 2, while wafers W go through the coating and developing process in the substrate treatment line Lu, a process consisting only of the resist film material coating treatment is carried out in the substrate treatment line Ld. The resist film material coating treatment is a single treatment, which is carried out in the resist film coating units RESIST. Thus, when inspecting and verifying the quality of the resist film material coating treatment, or putting the resist film coating units RESIST to a test run, operation may be carried out as described in the example of operation 2 to inhibit a sharp reduction in the working rate of this apparatus.

The treating section 3 has the treating blocks Ba and Bb arranged in juxtaposition, the substrate treatment line Lu is provided on the same stories K1-K2 of the treating blocks Ba and Bb, and the substrate treatment line Ld also is provided on the same stories K3-K4 of the treating blocks Ba and Bb. The control section 90 controls the main transport mechanisms $T_1$-$T_4$ on the respective stories K1-K4 to change the transport paths of wafers W on the stories K1-K4. Thus, the processes in the substrate treatment lines Lu and Ld can be changed separately and independently. In other words, it is possible to change each of the series of treatments on the same stories K1-K2 of the treating blocks Ba and Bb and the series of treatments on the same stories K3-K4.

The input unit 101 is provided, and the control section 90 carries out controls based on information inputted to the input unit 101. Thus, the operator who operates the input unit 101 can instruct changes in the transport paths conveniently.

The information inputted to the input unit 101 is information on the type and order of treatment given to wafers W in each of the substrate treatment lines Lu and Ld, or information identifying treating units and/or the particulars of treatment put to a test run. Thus, the control section 90 can determine transport paths conveniently.

The treating block Bb and ID section 1 are located adjacent the opposite sides of the treating block Ba, and wafers W treated in the coating units 31 are transported from the treating block Ba to the treating block Bb. Thus, a series of treatments including the treatment for applying the treating solution to the wafers W and the treatment for supplying the developer to the wafers W can be carried out smoothly. Further, by transporting wafers W treated in the coating units 31 from the treating blocks Ba to the ID section 1, only the treatment for applying the treating solution to the wafers W is carried out, and the wafers W can be returned to a cassette C promptly.

Since the IF section 5 is located adjacent the treating block Bb, wafers W can be transported from the treating block Bb to the exposing machine EXP through the IF section 5, and the wafers W exposed in the exposing machine EXP can be developed in the developing units DEV. Further, unexposed wafers W may be developed in the developing units DEV of the treating block Bb, without transporting the wafers W from the treating block Bb to the exposing machine EXP.

Embodiments of the present invention are not limited to the foregoing embodiments, but may be modified as follows:

(1) Although the examples of operation 1 and 2 have been described in the foregoing embodiment, the invention is not limited to these examples.

Figure 17:
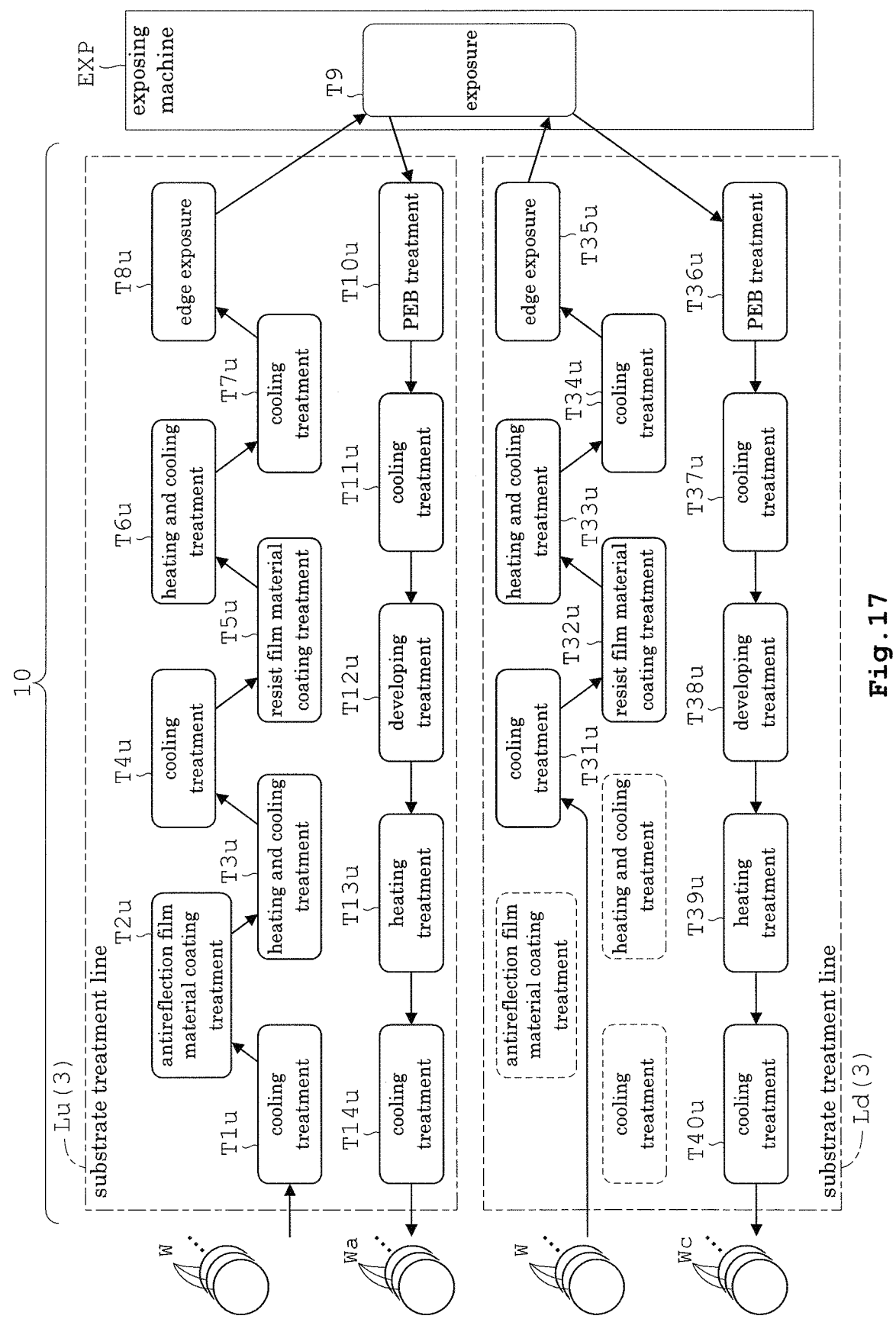
FIG. 17 is a schematic view showing an outline of a modified substrate treating apparatus.

Reference is made to FIG. 17. This is a schematic view showing an outline of a modified substrate treating apparatus. In the illustrated modification, the substrate treatment lines Lu and Ld carry out different processes of treatment for wafers W. The substrate treatment line Lu carries out the coating and developing process. The substrate treatment line Ld carries out a plurality of different types of treatment, which are the same as the coating and developing process excepting that the first three treatments (cooling treatment T1$u$, antireflection film material coating treatment T2$u$ and heating and cooling treatment T3$u$) are not carried out. The first three treatments in the coating and developing process are antireflection film material coating treatment T2, and heat treatments T1 and T3 relating thereto, which can be said the process for forming antireflection film on wafers W.

In this modification, the ID section 1 (ID transport mechanism $T_{ID}$) transports wafers W taken out of a cassette C to either one of the substrate treatment line Lu and Ld, and returns the wafers W from the substrate treatment line Lu and Ld to the cassette C. With such substrate transport by the ID section 1 (ID transport mechanism $T_{ID}$), wafers W can be treated through the process in either one of the substrate treatment lines Lu and Ld.

Further, in this modification, the ID section 1 (ID transport mechanism $T_{ID}$) transports all the wafers W taken out of a cassette C to the substrate treatment line Lu, transports the wafers W from the substrate treatment line Lu to the substrate treatment line Ld, and returns the wafers W from the substrate treatment line Ld to the cassette C. With such substrate transport by the ID section 1 (ID transport mechanism $T_{ID}$), all the wafers W can be treated through the process in the substrate treatment line Lu, and thereafter through the process in the substrate treatment line Ld. Such an example of operation can conveniently carry out double exposure for forming two or more patterns on the same oxide film on the wafers W.

(2) In the foregoing embodiment, as shown in FIGS. 1 and 2, the coating and developing process includes various treatments T1-T8 and T10-T14 carried out in this order. The invention is not limited to the above, but change may be made as appropriate.

(3) In the foregoing embodiment, the separate exposing machine EXP is disposed adjacent this apparatus 10, but this is not limitative. This apparatus 10 may not adjoin the exposing machine EXP.

(4) The foregoing embodiment provides two substrate treatment lines L, but the invention not limited to this. The construction may be modified to include three or more substrate treatment lines L vertically arranged in multiple stages. In this case, it is possible to uniform the processes in the substrate treatment lines L, and to provide two or more types of processes for the substrate treatment lines L. All the substrate treatment lines L may carry out different processes.

(5) In the foregoing embodiment, the substrate treatment lines L are arranged vertically, but the invention is not limited to this. For example, a modification may be made to arrange a plurality of substrate treatment lines L sideways or horizontally. Or a plurality of substrate treatment lines L may be arranged sideways as well as vertically.

(6) In the foregoing embodiment, the treating section 3 has a plurality of treating blocks Ba and Bb arranged in juxtaposition, but the invention is not limited to this. For example, the treating section 3 may be constructed of a single treating block with vertically divided stories. A single treating block providing the substrate treatment line Lu and a single treating block providing the substrate treatment line Ld may be arranged one over the other.

(7) In the foregoing embodiment, the substrate treatment lines L carry out all or part of the coating and developing process, but the invention is not limited to this. The substrate treatment lines L may be modified to perform other treatment such as cleaning of wafers W. Thus, the type, number and the like of treating units are selected or designed as appropriate. Further, the substrate treating apparatus may be constructed to exclude the IF section 5.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus comprising:
   a plurality of substrate treatment lines configured to carry out plural types of treatment on substrates while transporting the substrates horizontally; and
   a controller configured to change processes of treatment carried out on the substrates for each of the substrate treatment lines;
   wherein the substrate treatment lines are arranged vertically;
   wherein each of the substrate treatment lines includes:
      a plurality of treating units; and
      main transport mechanisms configured to transport the substrates to and from the treating units;
   wherein the controller is arranged to cause a first part of the substrate treatment lines to treat the substrates in a process in a normal operation, and a second part of the substrate treatment lines to treat the substrates in a test run, the test run comprising testing, inspecting, checking or verifying treatment quality or testing the treating units;
   wherein the process in the normal operation in the first part of the substrate treatment lines and the process in the test run in the second part of the substrate treatment lines are carried out in parallel;
   the substrate treating apparatus further comprises an input unit configured to input information to set substrate transport paths to each of the substrate treatment lines, wherein the controller is arranged to change the substrate transport paths for each of the substrate treatment lines based on the information inputted to the input unit;
   wherein the information inputted to the input unit is not set at the controller beforehand;
   wherein the information inputted to the input unit is information identifying treating units subject to the test run; and
   the controller is arranged to determine, based on the information identifying treating units subject to the test run, transport paths for transporting the substrates only to the treating units identified by the information identifying treating units subject to the test run.

2. The substrate treating apparatus according to claim 1 wherein the controller is arranged to cause the first part of the substrate treatment lines to treat the substrates in the process in the normal operation, and cause the second part of the substrate treatment lines to treat the substrates in the process in the test run, thereby to restore the second part of the substrate treatment lines.

3. The substrate treating apparatus according to claim 1 wherein the controller is arranged to cause the second part of the substrate treatment lines to transport the substrates only to the treating units subject to the test run.

4. The substrate treating apparatus according to claim 1 wherein the controller is arranged to cause all the substrate treatment lines to treat the substrates in the process in the normal operation.

5. The substrate treating apparatus according to claim 1 wherein, when the second part of the substrate treatment lines have been restored, the controller causes all the substrate treatment lines to treat the substrates in the process in the normal operation.

6. The substrate treating apparatus according to claim 1 wherein changes in the processes in the substrate treatment lines are made independently of each other.

7. The substrate treating apparatus according to claim 1 wherein the substrate transport paths determined by the controller are not set at the controller beforehand.

* * * * *